(12) United States Patent
Shiga

(10) Patent No.: US 7,660,704 B2
(45) Date of Patent: Feb. 9, 2010

(54) SCREW TIGHTENING DESIGNING METHOD AND SCREW TIGHTENING DESIGNING APPARATUS

(75) Inventor: Tsutomu Shiga, Nukata-gun (JP)

(73) Assignee: Denso Corporation, Kariya (JP)

( * ) Notice: Subject to any disclaimer, the term of this patent is extended or adjusted under 35 U.S.C. 154(b) by 674 days.

(21) Appl. No.: 11/528,442

(22) Filed: Sep. 28, 2006

(65) Prior Publication Data

US 2007/0078627 A1    Apr. 5, 2007

(30) Foreign Application Priority Data

Oct. 5, 2005    (JP) .............................. 2005-293047

(51) Int. Cl.
- *B21G 5/00* (2006.01)
- *G06F 17/50* (2006.01)
- *B21K 1/44* (2006.01)

(52) U.S. Cl. .................................. 703/1; 470/6; 470/58

(58) Field of Classification Search ...................... 703/1, 703/6, 7; 470/6, 9, 11, 18, 52, 53, 58

See application file for complete search history.

(56) References Cited

U.S. PATENT DOCUMENTS

| | | | | |
|---|---|---|---|---|
| 5,284,217 | A | * | 2/1994 | Eshghy ........................ 173/176 |
| 5,404,643 | A | * | 4/1995 | Rice .......................... 29/898.09 |
| 6,314,817 | B1 | * | 11/2001 | Lindback ...................... 73/761 |

* cited by examiner

*Primary Examiner*—Paul L Rodriguez
*Assistant Examiner*—Andre Pierre Louis
(74) *Attorney, Agent, or Firm*—Oliff & Berridge, PLC

(57) ABSTRACT

A method and apparatus for designing a screw-tightening element are disclosed for designing the screw-tightening element (mechanical element). The design method comprises representing material characteristics of the screw component with factors including at least one of an elastic limit, an endurance strength, a true breaking power and a tension strength, representing a material characteristic of the tightening object with a factor including an elastic limit, providing a plurality of damage patterns associated with the material characteristics of the screw component and the tightening object, and calculating tolerance values of fluctuating loads in the plurality of damage patterns based on the material characteristics of the screw-tightening element and the elastic limit of the tightening object. The tolerance values of fluctuating loads are compared to determine an optimum tolerance load for the screw-tightening element.

14 Claims, 12 Drawing Sheets

SCREW TIGHTENING DESIGNING METHOD AND SCREW TIGHTENING DESIGNING APPARATUS

CROSS REFERENCE TO RELATED APPLICATIONS

This application is related to Japanese Patent Application No. 2005-293047 filed on Oct. 5, 2005, the content of which is hereby incorporated by reference.

BACKGROUND OF THE INVENTION

1. Technical Field of the Invention

The present invention relates to methods of designing screw-tightening elements and, more particularly, to a method of and an apparatus for designing a screw-tightening element for clarifying the relationship between external forces and overall damage patterns encountered by the screw-tightening element for simply and reliably grasping a safety margin of the screw-tightening element in terms of the external forces.

2. Description of the Related Art

Screw tightening elements such as bolts or screws have been commonly used as mechanical elements to allow two component parts to be tightened together. Although these mechanical elements are simple in design, various issues arise with loosening, accompanied by a drop-off of the component part, or fracture of the bolt. In the event of severe situations, measures taken on the screw-tightening element have been found not to be effective with the resultant occurrence of pejorated tightening effects. Such a cause comes from screw tightening with a phenomenon difficult to understand and leads to complexity of the issue on screw tightening.

More particularly, we have a saying to the effect that "screwing up tight results in screw loosening and screwing up soft results in fracture". A common knowledge exists in that with a commonly used mechanical component to which a strong force (corresponding to a phase in which a strong tightening force is applied) is applied, stress naturally increases to exceed beyond tension strength of a material causing the occurrence of fracture. However, we have a completely opposite saying on the screw. Such logic is frequently used in explaining the screw whose details are introduced in specialized books and, hence, screw tightening is herein described below in connection with one technical case.

FIG. 1A is a tightening diagram showing spring characteristics of a bolt, playing a role as a tightening component of a tightening element, and a tightening object, playing a role as a tightening object of the tightening element, in terms of a load and elongation of the tightening element when the bolt is applied with a tightening force of F=4 kN. In FIG. 1A, a solid line B1 represents a displacement (elongation) characteristic of the bolt in terms of the load and a dotted line T1 represents a displacement (contraction) characteristic of the tightening object in terms of the load.

FIG. 1B shows a fatigue limit diagram representing variations in yield points of the tightening element in load representation upon multiplying a stress by a cross-sectional surface area of a screw. In FIG. 1B, a solid line B2 represents variation in a fatigue limit of the bolt and a solid line T2 represents a yield point of the tightening object.

With the tightening element remaining under such a condition, if an external force W acts on the tightening element, the bolt takes a load increase of $W_b$ (which will be referred to as an internal force). That is, no entire external force W acts on the bolt but only a partial component (playing a role as the internal force) of the external force W acts on the bolt. Accordingly, when the external force W acts on the bolt, an actual force P acting on the bolt is expressed as $P=F+W_b$.

Next, in explaining the external force in relation to a fluctuating load, a dynamic fatigue diagram is illustrated in FIG. 2A that represents the relationship between the external force W and the load increase $W_b$, shown in FIG. 1, to be obvious at one view. In FIG. 2A, AML represents amplitude load. AVL represents an average load. W represents the external load. Also, a dotted line T3 represents a displacement characteristic of the tightening object when applied with an axial force $F_4$. A dotted line T4 represents a displacement characteristic of the tightening object when applied with an axial force $F_2$.

FIG. 2A enables direct reading that, for instance, if the external force of W=5 kN acts on the bolt with the bolt being screwed with a tightening force with 4 kN (indicative of $F_4$ on a longitudinal axis), a force P=6 kN finally acts on the bolt.

Now, suppose the external force W is a cyclic load with 0 and 5 kN, the bolt tightened with the force $F_4$ (=4 kN) suffers from fluctuating axial forces of 4 kN and 6 kN. Similarly, when the bolt is tightened with $F_2$ (=2 kN), fluctuating axial forces of 2 kN and 5 kN act on the bolt. Incorporating such variables in the fatigue limit diagram in FIG. 1B results in FIG. 2B.

In FIG. 2B representing a fatigue limit diagram, a solid line B3 represents variation of a fatigue limit of the bolt and a dotted line T5 represents variation of a yield point of the tightening object. As will be apparent from FIG. 2B, with the bolt being tightened with a tightening force $F_2$, this causes the bolt to exceed a fatigue limit and the bolt is caused to fracture due to fatigue breakdown. However, with the bolt being tightened with a tightening force $F_4$, this causes the bolt to remain in a fatigue limit and no fatigue breakdown takes place in the bolt. That is, if the tightening force lies at a small value, then, the bolt is caused to fracture.

FIG. 3A is a dynamic fatigue diagram for the tightening element and FIG. 3B is a fatigue limit diagram for the tightening element. FIGS. 3A and 3B show comparison results with the bolt being tightened with tightening forces 4 kN and 8 kN in a case where the external force W is a cyclic load with 0 and 4 kN. In FIG. 3A, IF1 represents internal force acting on the bolt when applied with a tightening force $F_8$. IF2 represents internal force acting on the bolt when applied with a tightening force $F_4$. A dotted line T6 represents a displacement characteristic of the tightening object when applied with a tightening force $F_8$. A dotted line T7 represents a displacement characteristic of the tightening object when applied with the tightening force $F_4$.

As will be apparent from FIG. 3B, with the bolt being tightened with the tightening force $F_8$, the tolerance load exceeds an elastic limit (a yield point) of the bolt causing the bolt to undergo plastic deformation and elongation. Therefore, it becomes hard for the bolt to remain in a tightened status upon release of the external force, resulting in the occurrence of loosening of the bolt.

However, with the bolt being tightened with the tightening force $F_4$, this force allows the bolt to remain in a fatigue limit and no loosening of the bolt takes place. That is, the presence of the tightening force remaining in a large value results in the occurrence of loosening of the bolt.

From the foregoing description, it will be understood that the wondering saying stated for the screw tightening is correct. That is, no external force acts on the bolt intact and only a partial component of the external force acts on the bolt as an internal force. This internal force is represented in a wondering relationship between the external force W and a force F.

Therefore, although experts in the field of the screw say that a bolt should not be tightened too tight or never leave a bolt under a non-tightened state and it is all in how a bolt is properly tightened, it is a reality that no clarification is made on what is a proper tightening. Even if a question is asked to a skilled person in the screw field, nobody can make correct answer.

Further, another restriction appears in a case (involving situations such as a sealed component part or an electrically conductive component part) that needs a tightened area in a closely tight fit. In the related art, attempts have heretofore been practiced to identify a whole of various factors in relation to such loaded conditions one by one using the methods described above to determine mechanical characteristics and a dimension of a demanded bolt.

However, such a design method results in the occurrence of frequent risks wherein calculations are practiced using merely the greatest values of an external force and a tightening force with the resultant judgment in error in that designed results fall in a fatigue limit and elastic limit to be acceptable. As mentioned above, the smaller the tightening force, the worse will be the bolt in respect of a fatigue limit.

Furthermore, even in trying to study the smallest values of the external force and tightening force acting on the bolt, it has been a status quo for the tightening element to be designed in an incomplete and inefficient method wherein even the existence of a local maximal value and a local minimal value among combinations between the external force W and the tightening force F is hardly confirmed.

Moreover, the design method of the related art has heretofore been conducted on the ground of implicit assumption in that screw tightening has a major premise with no occurrence of plastic deformation in a tightening object even when applied with any external force.

For instance, with a structure shown in FIG. 4 wherein two plate-like members 10, 12 are directly tightened together by means of a bolt 14 and a nut 16, the tightening objects can bear a remarkably larger external force than that applied to the bolt in respect of material characteristic. Thus, no substantial risk occurs on the tightening objects to suffer from plastic deformation. In the absence of such assumption, the design method of the related art mentioned above relying on repeated attempts in try and error needs to execute calculations based on an astronomical amount of combinations of variables, making it almost impossible to design a screw-tightening.

In this connection, it has been an increasing trend in usual practice for a modern internal combustion engine to employ an auxiliary unit that, with a view to achieving a miniaturization with lightweight in structure and a reduction in man-hour on assembling has a screw-tightening structure (that is, in the form of a so-called hollow structure) such as one of those shown in FIGS. 5A and 5B with no tightening object surrounding an entire periphery of a screw-tightening component.

FIG. 5A shows a flange-structure as viewed in a compressor or an alternator. In FIG. 5A, the flange structure includes two flat panels 18, 18 and a cylindrical intermediate member 20 formed with a pair of outwardly extending annular flange portions 20*a*. With such a structure, a tightening bolt 22 is inserted through the flat panels 18, 18, the annular flange portion 20*a*, 20*a* of the cylindrical intermediate member 20 and a nut 24 is screwed onto the bolt 22 to tighten these associated component parts. With the structure shown in FIG. 5A, no entire periphery of the tightening bolt 20 is surrounded with the intermediate member 20.

FIG. 5B shows an exemplarily unitized structure wherein a frame 30 carries thereon a yoke 32 on which an end cover 34 is mounted for use in a starter motor. The frame 30, the yoke 32 and the end cover 34 are tightened together by means of two sets of tightening bolts 36 with only one bolt being shown in FIG. 5B.

With the structure shown in FIG. 5A, if the flat members 18, 18 are applied with external forces W in opposite directions, distal ends of the flat members 18, 18 are caused to deflect in a manner as designated at 18', 18' and the flange portions 20*a*, 20*a* are deflected as designated at 20*a*' and 20*a*'. Similar phenomenon also occurs in the structure shown in FIG. 5B with the end cover 34 being deflected as designated at 34' when applied with an external force W. In any of these exemplary structures, as the tightening bolt is tightened with an increased force, plastic deformation occurs in the associated tightening objects with the same extent as experienced by plastic deformation of the bolt. Thus, these structures exemplarily represent cases with no margin being present in tightening effects.

FIG. 6 shows a tightening diagram for a tightening bolt and a tightening object in an actual example (with a tightening force F=6 kN) of the structure shown in FIG. 5B. In FIG. 6, a curve C1 represents a displacement (elongation) characteristic of the tightening bolt in terms of a load. A curve C2 represents a displacement (contraction) characteristic of the tightening object in terms of the load. A1 represents a tension external force W acting on the bolt and the tightening object. A2 represents a compression external force W acting on the bolt and the tightening object.

It will be appreciated from FIG. 6 that the tightening object has a proportional limit (nearly equal to an elastic limit) with a margin less than that of a proportional limit of the bolt. In fact, with such a margin, screw tightening needs to be watched under extremely severe management.

In the related art practice as disclosed in every literature, attempt has been made to explain a theory of a screw with reference to an exemplary case where an external force to be applied includes fluctuating tension load (such as the external force W including a cyclic load with 0 and 5 kN in tension in the exemplary case shown in FIG. 2A). As a tension load A1 is applied to the external force W, the load acting on the bolt further increases with a possible disadvantageous effect. However, such a load acts on the tightening object in an orientation to reduce an axial load on a safety side. Therefore, no discussion has heretofore been made on an application limit related to the tightening object. However, if the tightening object is subjected to an external force such as a compressive force, then, the tightening object suffers from an adverse affect. That is, the adverse affect results in the loosening of the bolt due to plastic deformation of the tightening object and the tightening object is caused to contract too much. This causes a gap to be formed to create an opening at an abutment interface of the tightening object. With the exemplary case shown in FIG. 1A, as the compressive external force greater than 10 kN is applied, the tightening object is cased to contract by a value of approximately 0.1 mm in the absence of a contact pressure between the tightening component and the tightening object.

The external force, acting on the auxiliary component part used in the internal combustion engine, mostly depends on a force involved in vibration. That is, such an external force includes an alternatively fluctuating external force in tension and compressive loads with the same magnitudes. Also, auxiliary units employed in modern engines have many probabilities to take the structure with the characteristics shown in FIG. 6. As will be obvious from FIG. 6, as the external force W acts on the bolt with the bolt being tightened with the tightening force F (=6 kN), the bolt is subjected to tension to allow axial force acting on the bolt to lie at a point D1 and still remains within the elastic limit. Concurrently, the tightening object is subjected to compression to allow axial force acting on the tightening object to lie at a point D2 that exceeds beyond the elastic limit accompanied by the occurrence of the loosening of the bolt.

That is, the screw-tightening structures of the auxiliary component parts installed on the internal combustion engine have encountered with an increasing risk involved in the occurrence of plastic deformation to the same extent as experienced by the bolt. It has heretofore been mostly impossible to design screw-tightening for the tightening object formed in such a hollow structure and, in actual practice, the screw-tightening design has been implemented based on measurements conducted only on actual bolts. Therefore, the design needs time consuming studies accompanied by an increase in cost while suffering sometimes from omission of important factors for the design.

As stated above, it has been a status quo to rely on an orthodox method in that when designing a screw-tightening element, a stress is calculated, based on a predicted external force, for comparison to a mechanical characteristic of a screw material to study an issue on whether or not the screw-tightening element suffers from damage upon which if the issue is found, a dimension or material of the screw-tightening element is altered.

However, such a method needs to be implemented through trial and error. This could be extremely time consuming, and in a worst case scenario faces the risk of important data being lost. Least of all, even with damage occurred to a screw portion in fact, it has been extremely difficult to perform back calculation to find what kind of external force is a cause of damage occurring on such a structure. With no alternatives, it has been a status quo to take an inefficient method whose calculation result needs to be confirmed on a real machine on a final stage. This results in vain efforts involving work for setting the bolt to an increased size beyond necessity or increasing precision of the bolt. Even with such an attempt, the issue related to the screw tightening cannot be addressed in present situations. Therefore, it has been impossible to display safety margins of the bolt in terms of external forces associated with particular damage patterns at one view or to evaluate a design result in a precise fashion.

With the screw-tightening design method remaining under such a status quo, it has been nearly impossible to make a design in advance to find out the relationship between plastic deformation of a tightening object and applied load that raises an issue when applied to an auxiliary unit of an automobile engine for collectively mounting associated plural component parts in a lump through the use of a plurality of tightening bolts. Therefore, even no attempt has heretofore been made in the related art design method to bring up the issue of deficiency, resulting from the characteristic of the tightening object, as an item needed to be taken into account for confirmation on experiments.

SUMMARY OF THE INVENTION

The present invention has been completed with a view to addressing such issues mentioned above and has an object to provide a design method and a design apparatus that can clarify the relationship between overall factors adversely affecting quality of screw-tightening and related damage patterns for enabling the damage patterns of a screw-tightening element to be evaluated at one view with no omission of various factors.

To achieve the above object, one aspect of the present invention provides a method of designing a tolerance load of a screw-tightening element, composed of a screw component and a tightening object to be fastened in a screw-tightening structure, which is susceptible to a fluctuating cyclic load. The method comprises representing material characteristics of the screw component with factors including at least one of an elastic limit, a fatigue limit, a true breakdown stress and tension strength, and representing a material characteristic of the tightening object with a factor including an elastic limit. A plurality of damage patterns associated with the material characteristics of the screw component and the tightening object. Tolerance values of the fluctuating cyclic load acting on the screw-tightening element are calculated based on the damage patterns of the screw-tightening element using the elastic limit of the tightening object and the tolerance values of the fluctuating cyclic load are compared for determining a tolerance load available for the screw-tightening element to withstand the fluctuating cyclic load.

With such a design method, the material characteristic of the screw component are represented with at least one of the elastic limit, the fatigue limit, the true breakdown stress and the tension strength, while the elastic limit is used to represent the material characteristic of the tightening object. Then, the tolerance values associated with various damage patterns are calculated using the elastic limit of the tightening object. These tolerance values are compared to determine the tolerance load available for the screw-tightening element to withstand the fluctuating cyclic load. This provides capability of designing the screw-tightening element to prevent damage thereto in advance. Thus, proper measure can be taken for the screw-tightening element, thereby providing a reliable tightening structure with no occurrence of loosening accompanied by a gap formed at an abutment interface of the tightening object. This provides a highly reliable bolt connection particularly suited for use in an auxiliary unit of an automobile engine that is susceptible to vibration encountered by a vehicle during running on rough roads.

With the design method set forth above, the damage patterns may include a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof.

With such a design method, the entire damage patterns of the screw-tightening element are classified and appropriate design of the screw-tightening element can be achieved with no risk in omission of important factors related to the occurrence of damage to the screw-tightening element.

With the design method set forth above, the tightening object may have a structure in which no entire periphery of the screw component is covered.

With such a design method, the screw-tightening element can be designed with a focus not only on the screw component but also on the tightening object. More particularly, the screw-tightening element can be designed upon taking a tubular structure of the tightening object into consideration. Therefore, even when the screw-tightening element is specified for use in the tightening object that is susceptible to plastic deformation, a proper tightening structure can be provided in a highly reliable fashion.

With the design method set forth above, the screw-tightening element may comprise a structural element of an auxiliary unit to be mounted on an internal combustion engine.

With such a design method, the screw-tightening element forms a part of the structural element of the auxiliary unit of the internal combustion engine. This contributes to a minimization with lightweight in structure while achieving a reduction in cost.

Another aspect of the present invention provides a computerized method of designing a tolerance load of a screw-tightening element based on a sequence of a flow chart. The computerized method comprises receiving, at a computer, a dimension and a material characteristic of the screw-tightening element as input values, and calculating tolerance values of loads, related to damage patterns including a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof, based on the input values. The tolerance values are compared for determining a tolerance load for the screw-tightening element.

With such a computerized design method, merely inputting the dimension and the material characteristic of the screw-tightening element to the computer allows everybody to easily design the screw-tightening element without the occurrence of errors even in the presence of a big difference in between the proportionate limit and the elastic limit.

Another aspect of the present invention provides a method of designing a screw-tightening element, composed of a screw component and a tightening object to be fastened in a screw-tightening structure and susceptible to a fluctuating cyclic load, the method comprising calculating a tolerance load based on a shape of a screw tightening area, a material characteristic and a tightening force, displaying the relationship between the tightening force and the tolerance load on a graph, and determining an application limit of the screw-tightening element.

With such a design method, by calculating the tolerance load based on the shape of the screw tightening area, the material characteristic and the tightening force, the relationship between the tightening force and the tolerance load can be displayed on a graph. This allows an application limit of the screw-tightening element to be grasped at one view in an easy fashion without causing omission of important factors, making it easy to take preventative measures to prevent damage to the screw-tightening element.

A further aspect of the present invention provides a method of designing a tolerance load of a screw-tightening element, composed of a screw component and a tightening object to be fastened in a screw-tightening structure, which is susceptible to a fluctuating cyclic load, the method comprising representing material characteristics of the screw component with factors including at least one of an elastic limit, a fatigue limit, a true breakdown stress and a tension strength, representing a material characteristic of the tightening object with a factor including an elastic limit, providing a plurality of damage patterns associated with the material characteristics of the screw component and the tightening object, providing a first critical load of a tension force above which the screw component is caused to elongate to form a gap at an abutment interface of the tightening object, and providing a second critical load of a compressive force above which the tightening object is caused to contract to form the gap at the abutment interface of the tightening object. Tolerance values of the fluctuating cyclic load acting on the screw-tightening element are calculated based on the damage patterns of the screw-tightening element using the elastic limit of the tightening object. The tolerance values of the fluctuating cyclic load are compared to the first and second critical loads for determining a tolerance load available for the screw-tightening element to withstand the fluctuating cyclic load.

With such a design method, the tolerance values associated with various damage patterns are calculated using the elastic limit of the tightening object with at least one of the elastic limit, the fatigue limit, the true breakdown stress and the tension strength representing the material characteristic of the screw component. The tolerance values are compared to the first and second critical loads for determining a tolerance load available for the screw-tightening element to withstand the fluctuating cyclic load. This provides capability of designing the screw-tightening element to prevent damage thereto to provide a reliable tightening structure.

With the design method set forth above, the damage patterns may include a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof.

With such a design method, the entire damage patterns of the screw-tightening element are utilized to achieve appropriate design of the screw-tightening element. This enables the screw-tightening element to be easily designed with no occurrence of risk in omission of important factors related to the occurrence of damage to the screw-tightening element.

With the design method set forth above, the first and second critical loads may be given by $$R = K_b\left(\frac{F}{K_b} + \frac{F}{K_f}\right)$$
$$= F\left(1 + \frac{K_b}{K_f}\right)$$
$$= F\left(1 + \frac{1}{\gamma}\right)$$
$$= F(1 + \beta)$$

and $$S = K_f\left(\frac{F}{K_b} + \frac{F}{K_f}\right)$$
$$= F\left(1 + \frac{K_f}{K_b}\right)$$
$$= F\left(1 + \frac{1}{\beta}\right)$$
$$= F(1 + \gamma)$$

where:
R=the first critical load
S=the second critical load
F=a tightening force applied to the screw-tightening element
$K_b$=a spring constant of the screw component
$K_f$=a spring constant of the tightening object β=a ratio of a spring constant $K_b$ to a spring constant $K_f$
γ=a ratio of the spring constant $K_f$ to the spring constant $K_b$ With such a design method, the first and second critical loads can be derived using Equations given above. Thus, the tolerance load of the screw-tightening element can be easily obtained upon comparison with the first and second critical loads. This provides an ease of designing the screw-tightening element in a reliable fashion.

With the design method set forth above, the method of designing the tolerance load of the screw-tightening element may further comprises providing a plurality of external force patterns acting on the tightening object, and calculating axial forces acting on the screw component and the tightening object.

With such a design method, the tolerance load of the screw-tightening element can be determined in association with the plurality of external force patterns with no occurrence of risk in omission of important factors.

With the design method set forth above, the calculating axial forces may be executed based on Equations (3) and (4) given as $$P_1 = F + \frac{W_m + W_r}{1+\gamma} \tag{3}$$

and $$P_2 = F + \frac{W_m - W_r}{1+\gamma} \tag{4}$$

where
$P_1$=the axial force acting on the screw component
$P_2$=the axial force acting on the tightening object
$W_m$=an average load
$W_r$=the critical load With such a design method, the axial force acting on the screw-tightening element can be easily calculated to determine the internal stress acting in the screw-tightening element. This enables the screw-tightening element to be precisely designed to provide an optimum tightening structure.

With the design method set forth above, the method of designing the tolerance load of the screw-tightening element may further comprise calculating an average load acting on the screw-tightening element based on the axial forces and the external forces in an Equation (5) expressed as:

$$\sigma_m A = \frac{P_1 + P_2}{2} = F + \frac{W_m}{1+\gamma} \tag{5}$$

where:
$\sigma_w$=a fluctuating fatigue limit of the bolt
$\sigma_T$=the true breakdown stress
$\sigma_m$=an average stress
$\sigma_r$=an amplitude stress
A=a cross-sectional surface area With such a design method, the average load acting on the screw-tightening element can be calculated based on the axial forces and the external forces. This leads to precise calculation of the tolerance load of the screw-tightening element.

With the design method set forth above, the method of designing the tolerance load of the screw-tightening element may further comprise calculating an amplitude load acting on the screw-tightening element based on the axial forces and the external forces in Equation (6) expressed as:

$$\sigma_r A = \sigma_w\left(1 - \frac{\sigma_m}{\sigma_T}\right)A = \frac{P_1 + P_2}{2} = F + \frac{W_r}{1+\gamma} \tag{6}$$

With such a design method, the amplitude load acting on the screw-tightening element can be calculated based on the axial forces and the external forces. Therefore, the tolerance load of the screw-tightening element can be determined to provide a tightening structure that can properly withstand the fluctuating cyclic load applied to the screw-tightening element.

With the design method set forth above, the comparing the tolerance values of the fluctuating cyclic load may comprise determining a tolerance load of the screw component to avoid fatigue fracture thereof using Equation (7) given by $$W_r \leq (1+\gamma)\left\{\sigma_w A - \frac{\sigma_w}{\sigma_T}F\right\} - \frac{\sigma_w}{\sigma_T}W_m \tag{7}$$

With such a design method, since the tolerance load of the screw component can be determined in a precise manner, the screw-tightening element can be properly designed with characteristics to avoid damage even when applied with fluctuating cyclic load.

With the design method set forth above, the comparing the tolerance values of the fluctuating cyclic load may comprise determining a tolerance load of the screw component to avoid loosening thereof due to plastic deformation using Equation (8) given by $$W_r \leq (1+\gamma)(Y-F) - W_m \tag{8}$$

where:
Y=a yield load of the screw component.

With such a design method, since the tolerance load of the screw component can be determined in a precise manner to avoid plastic deformation accompanied by the occurrence of loosening, the screw-tightening element can be properly designed with characteristics to avoid damage even when applied with fluctuating cyclic load.

With the design method set forth above, the comparing the tolerance values of the fluctuating cyclic load may comprise determining a tolerance load of the tightening object to avoid plastic deformation thereof using Equation (9) given by $$W_r \leq (1+\beta)(Yf-F) + W_m \tag{9}$$

where:
Yf=a yield load of the tightening object.

With such a design method, since the tolerance load of the tightening object can be determined to avoid plastic deformation, the screw-tightening element can be properly designed with characteristics to avoid damage even when applied with fluctuating cyclic load.

Another aspect of the present invention provides a screw-tightening designing apparatus for designing a tolerance load of a screw-tightening element, composed of a screw component and a tightening object to be fastened in a screw-tightening structure, which is susceptible to a fluctuating cyclic load. The screw-tightening designing apparatus comprises a CPU that is input with material characteristics of the screw component representing factors including at least one of an elastic limit, a fatigue limit, a true breakdown stress and a tension strength, a material characteristic of the tightening object representing a factor including an elastic limit, and input means for providing a plurality of damage patterns associated with the material characteristics of the screw component and the tightening object. The CPU calculates tolerance values of the fluctuating cyclic load acting on the screw-tightening element based on the damage patterns of the screw-tightening element using the elastic limit of the tightening object. The CPU compares the tolerance values of the fluctuating cyclic load for determining a tolerance load available for the screw-tightening element to withstand the fluctuating cyclic load.

DETAILED DESCRIPTION OF PREFERRED EMBODIMENTS

Now, description is concretely made of a method of designing a tolerance load of a screw-tightening element, composed of a screw component and a tightening object, which is susceptible to alternating fluctuating load and fastened in a screw-tightening structure.

Figure 7:
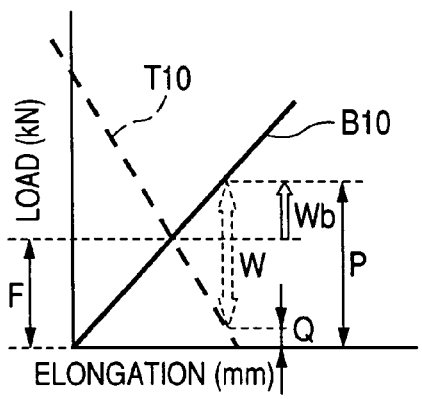
FIG. 7 is a view showing variations in spring constants of a screw component and a tightening object.

FIG. 7 is a view showing a tightening diagram of a bolt and a tightening object. In FIG. 7, B10 represents a displacement (elongation) characteristic of the bolt in terms of load applied thereto and T10 represents a displacement (contraction) characteristic of the tightening object in terms of load applied thereto. As shown in FIG. 7, let's consider a condition where a bolt with a spring constant Kb and a tightening object with a spring constant Kf are tightened together with a tightening force F.

In FIG. 7, as an external force W is applied to the bolt, the load acting on the bolt increases by a value of $W_b$, playing a role as an internal force, which is given by $$W_b = W \frac{K_b}{K_b + K_f} \quad (1)$$

Accordingly, axial force P acting on the bolt is given by $$P = F + \frac{W}{1 + \gamma} \quad (2)$$

where γ is expressed as $$\gamma = \frac{K_f}{K_b} \quad (3)$$

Likewise, axial force Q acting on the tightening object is expressed as $$Q = F - \frac{W}{1 + \beta} \quad (4)$$

where β is expressed as $$\beta = \frac{K_b}{K_f} = \frac{1}{\gamma} \quad (5)$$

Although Q naturally represents compressive load in a negative value, such a symbol is treated to take a positive value on the equation.

Figure 8A:
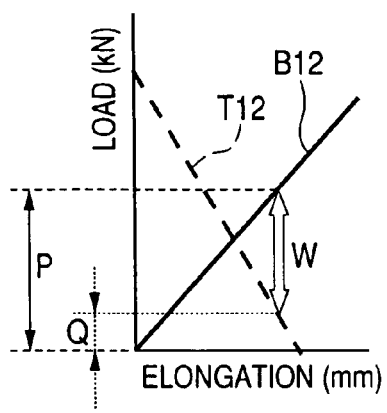
FIG. 8A is a view showing a screw-tightening diagram represented in an expression used for explanation in the related art.
Figure 8B:
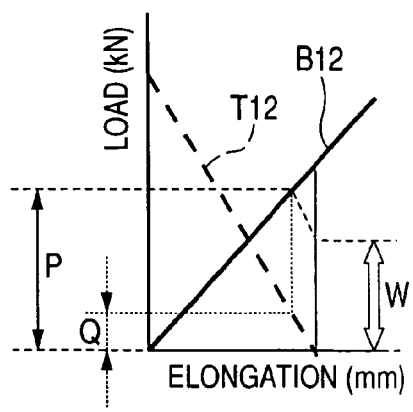
FIG. 8B is a view showing a screw-tightening diagram represented in an expression used for explaining a screw-tightening method according to the present invention.

To simplify a subsequent explanation, the relationship between the external force and the axial force acting on the bolt in the tightening diagram shown in FIG. 7 is rewritten using a geometric relationship. It can be easily understood that the representation in FIG. 8A, similar to FIG. 7, can be converted to FIG. 8B in illustration. That is, FIG. 8B represents a tightening diagram wherein external force W is plotted in a right area and associated axial force (with P representing axial force acting on the bolt and Q representing axial force acting the tightening object) are plotted in a left area. In FIGS. 8A and 8B, B12 represents a displacement (elongation) characteristic of the bolt in terms of load applied thereto and T12 represents a displacement (contraction) characteristic of the tightening object in terms of load applied thereto.

Figure 9:
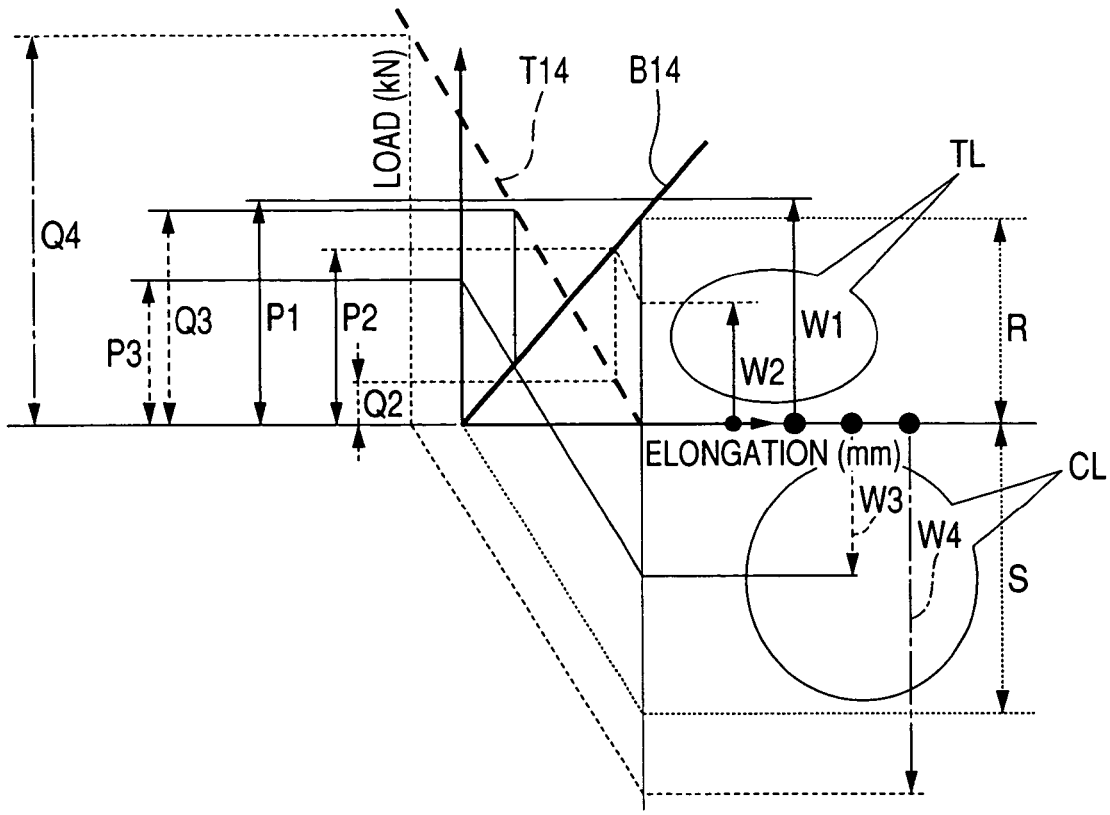
FIG. 9 is a view showing an elongated status of a bolt and a loosened status of a tightening object applied with four patterns of external forces.

FIG. 9 represents the magnitudes of the axial forces P, Q in terms of a difference in the magnitude of the external force W acting on the bolt under a tightening condition represented in a certain arbitrary tightening diagram in accordance with a display method shown in FIG. 8B. In FIG. 9, a solid line B14 represents a displacement (elongation) characteristic of the bolt in terms of load applied thereto and T14 represents a displacement (contraction) characteristic of the tightening object in terms of load applied thereto. TL represents cases with tension loads W1, W2 being applied and CL represents compressive loads W3, W4 being applied. R represents a critical load of a tension external force under which a bolt is caused to elongate to form a gap at an abutment interface between the bolt and the tightening object. S represents a critical load of a compressive external force under which the tightening object is caused to contract to form a gap at the abutment interface.

As will be apparent from FIG. 9, four kinds of external force patterns are found in ranges for the load limits R and S with axial forces acting on the bolt and tightening object being plotted in FIG. 9 in correspondence to the external forces. In FIG. 9, the kinds of loads are designated with W with suffixes "1" to "4" attached thereto.

The external forces, the axial forces on the bolt and the axial forces on the tightening object are expressed in magnitude as:

External Force: W1>W2>W3>W4
Axial Force on Bolt: P1>P2>P3>P4
Axial Force on Tightening Object: Q1<Q2<Q3<Q4

Now, let's consider that the external force W takes a positive code for a tension load and a negative code for a compressive load. In this case, from Equations (2) and (3), the external force patterns (2) and (3) can be classified into a completely identical pattern and, therefore, there are substantially three kinds of external force patterns. That is, the relational expression between the external force W and the axial forces P, Q are given as For a status (1), $$P=W, Q=0 \tag{6}$$

For statuses (2) and (3), $$P = F + \frac{W}{1+\gamma} \ (7), Q = F - \frac{W}{1+\beta} \tag{7}$$

For a status (4), $$P=0, Q=-W \tag{8}$$

As already described with reference FIG. 9, R represents the critical load of tension external force under which the bolt is caused to elongate to form the gap at the abutment interface of the tightening object and S represents the critical load of the compressive external force under which the tightening object is caused to contract to form the gap at the abutment interface of the tightening object. Any of these critical loads causes the associated component parts to deform within respective elastic limits. The R and S have values expressed as $$R = K_b\left(\frac{F}{K_b} + \frac{F}{K_f}\right) = F\left(1 + \frac{K_b}{K_f}\right) = F\left(1 + \frac{1}{\gamma}\right) = F(1+\beta) \tag{9}$$

$$S = K_f\left(\frac{F}{K_b} + \frac{F}{K_f}\right) = F\left(1 + \frac{K_f}{K_b}\right) = F\left(1 + \frac{1}{\beta}\right) = F(1+\gamma) \tag{10}$$

With the above equations in mind, a description is made of a critical load of the tightening object that does not exceed a fatigue limit and an elastic limit of a material when applied with a cyclic load (external force). Concretely, an amplitude load $W_r$, which does not exceed material strength when applied with an average value $W_m$ (or tightening force F) of the cyclic load, is obtained. That is, a tolerance range of $W_r$ is obtained.

Figure 10:
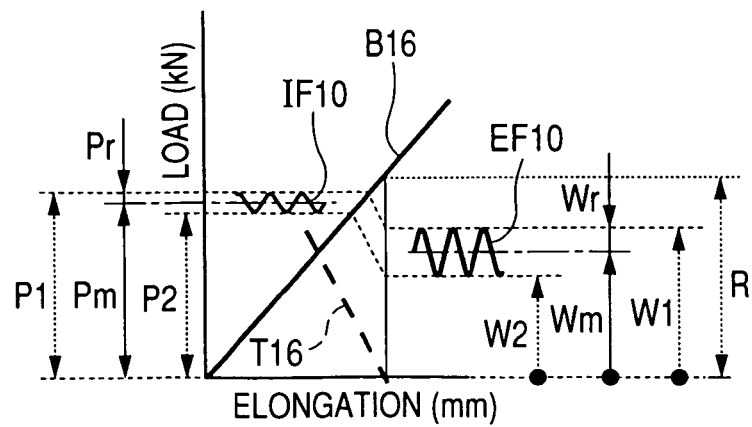
FIG. 10 is a view showing a pattern, in which the mostly common external force acts on a bolt, and internal force acting in the bolt.

FIG. 10 represents a tightening diagram plotted in terms of a load and elongations of a bolt and a tightening object. In FIG. 10, a solid line B16 represents a displacement (elongation) characteristic of the bolt in terms of load applied thereto and T16 represents a displacement (contraction) characteristic of the tightening object in terms of load applied thereto. In FIG. 10, IF 10 represents internal force acting on the bolt and the tightening object. EF 10 represents external force acting on the bolt and the tightening object.

For instance, let's consider the mostly common case as that shown in FIG. 10 wherein a maximal value of an external force is assigned to be $W_1$ and a minimal value of the external force is assigned to be $W_2$, then, axial forces $P_1$ and $P_2$ are expressed based on Equation 7 as $$P_1 = F + \frac{W_1}{1+\gamma}, P_2 = F + \frac{W_2}{1+\gamma} \tag{11}$$

Further, definitions give the external forces $W_1$ and $W_2$ as $$W_1 = W_m + W_r, W2 = W_m - W_r \tag{12}$$

On eliminating $W_1$ and $W_2$ from Equations 10 and 11, the axial forces $P_1$ and $P_2$ are given by $$P_1 = F + \frac{W_m + W_r}{1+\gamma}, P_2 = F + \frac{W_m - W_r}{1+\gamma} \tag{13}$$

Figure 11:
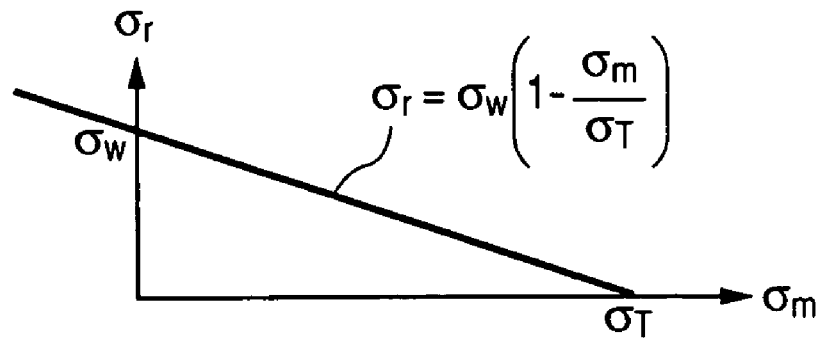
FIG. 11 is a view showing a fatigue limit diagram of a bolt.

Here, suppose a fatigue limit diagram of a bolt is shown in FIG. 11 and the following factors are defined as:

$\sigma_2$: fluctuating (in tension and compression) fatigue limit of a bolt $\sigma_T$: true fracture stress of material $\sigma_m$: average stress $\sigma_r$: amplitude stress A: cross-sectional surface area of a bolt However, it is needless to say that in studying a screw thread of the bolt, the above factors represent material characteristics of the screw thread taken in consideration stress concentration and in studying a shaft portion (such as, for instance, a straight stem portion) of the bolt, the above factors represent material characteristics of the shaft portion taken in consideration stress concentration.

Now, assume that the bolt tolerates a load in full blast of a fatigue limit (on consideration of Equation 13), an average load is given by $$\sigma_m A = \frac{P_1 + P_2}{2} = F + \frac{W_m}{1+\gamma} \quad (14)$$

An amplitude load is given by $$\sigma_r A = \sigma_w\left(1 - \frac{\sigma_m}{\sigma_T}\right)A = \frac{P_1 - P_2}{2} = \frac{W_r}{1+\gamma} \quad (15)$$

Substituting Equation 14 into Equation 15 eliminates am and on arrangement, a tolerance range of the amplitude load $W_r$ is expressed as $$W_r \leq (1+\gamma)\left\{\sigma_w A - \frac{\sigma_w}{\sigma_T}F\right\} - \frac{\sigma_w}{\sigma_T}W_m \quad (16)$$

Expression 16 represents a formula for obtaining an external force with an amplitude value thereof tolerated not to cause fatigue to occur in a bolt when a material characteristic of the bolt is determined. In contrast, if an amplitude load exceeding such a value is applied to the bolt, the bolt undergoes fatigue fracture.

Figure 12:
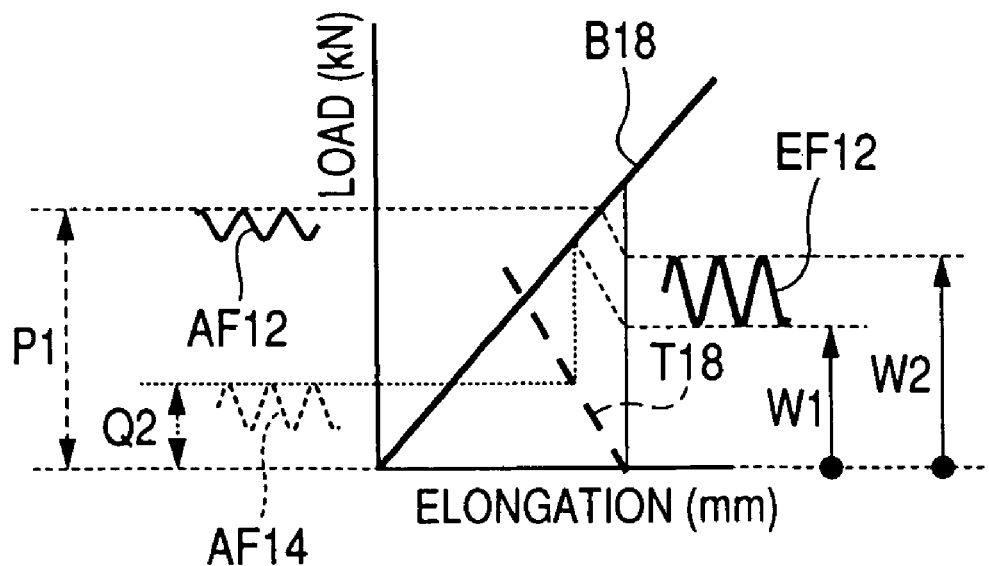
FIG. 12 is a view showing axial force acting on a bolt and an axial force acting on a tightening object when applied with an external force.

Next, the relationship between an elastic limit and an external force is studied with reference to FIG. 12. In FIG. 12, a solid line B18 represents a displacement (elongation) characteristic of the bolt in terms of load applied thereto and T18 represents a displacement (contraction) characteristic of the tightening object in terms of load applied thereto. AF 12 represents axial force acting on the bolt and AF 14 represents axial force acting on the tightening object.

Now, assume that a load is tolerated in full blast of an elastic limit provided that $\sigma_y$ represents a yield stress of a screw thread, a yield load Y is expressed as $$Y = \sigma_y \times A$$

where a symbol "Y" represents a yield load of a tightening object.

The bolt has a concern whether or not axial force P exceeds beyond an elastic limit and, therefore, axial force P has a maximal value at the external force $W_1$. That is, from $Y=P_1$ (in consideration of Equation 13), a tolerable range of an amplitude $W_r$ of an external force for the bolt is given by $$W_r \leq (1+\gamma)(Y-F)-W_m \quad (17)$$

Similarly, for the tightening object, the axial force Q has the maximum value that corresponds to an external force $W_2$.

From $Yf=Q_2$ (in consideration of Equation 7), a tolerance range of the external force amplitude $W_r$ for the tightening object is expressed as $$W_r \leq (1+\beta)(Yf-F)+W_m \quad (18)$$

With the above, Equations 9 and 10 represent tolerance limits of external forces for the abutment interface of the tightening object to be formed with a gap. Equation 16 represents a tolerance limit of the external force for a screw to undergo fatigue fracture. Also, Equations 17 and 18 represent tolerance limits of external forces for the loosening to occur in the tightening element.

However, as set forth above, the external force is substantially classified in the three kinds of external force patterns and all patterns for each of the external forces $W_1$, $W_2$ can be assumed with combinations resulting in a total of six kinds. All of these combinations are simulated in FIGS. 13A to 13F. A common applied external force, set forth above, is represented in FIG. 13D.

Figure 13A:
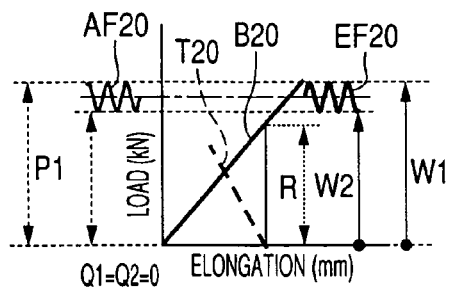
FIGS. 13A to 13F are views showing variations in axial forces acting on a bolt and a tightening object when applied with six kinds of external forces.

In FIG. 13A, a solid line B20 represents a displacement (elongation) characteristic of the bolt in terms of load applied thereto and T20 under a condition with $R \leq W_2$. AF 20 represents axial force acting on the bolt and EF 20 represents external force.

Figure 13B:
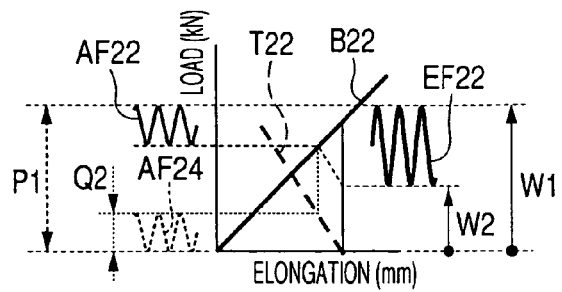

In FIG. 13B, a solid line B22 represents a displacement (elongation) characteristic of the bolt in terms of load applied thereto and T22 represents a displacement (contraction) characteristic of the tightening object in terms of load applied thereto under a condition with $W_2 < R \leq W_1$ and $-W_2 < S$. AF 22 represents axial force acting on the bolt and AF 24 represents axial force acting on the tightening object. Also, EF 22 represents external force.

Figure 13C:
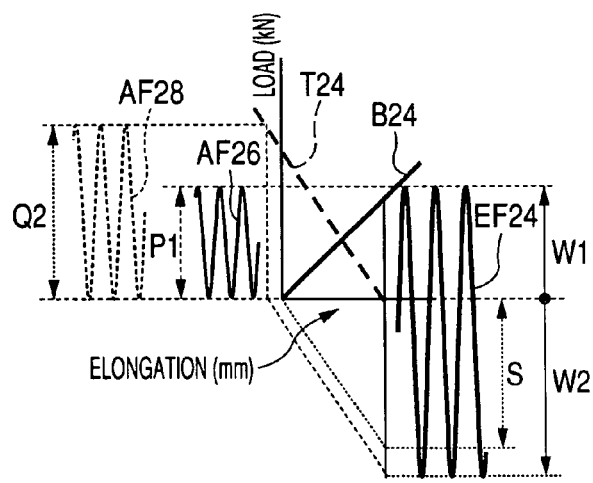
Figure 13D:
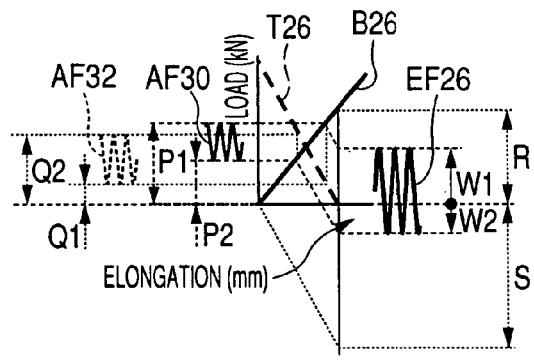

In FIG. 13C, a solid line B24 represents a displacement (elongation) characteristic of the bolt in terms of load applied thereto and T24 represents a displacement (contraction) characteristic of the tightening object in terms of load applied thereto under a condition with $W_2 < R \leq W_1$ and $-W_2 > S$. AF 26 represents an axial force acting on the bolt and AF 28 represents axial force acting on the tightening object. Also, EF 24 represents external force.

In FIG. 13T, a solid line B26 represents a displacement (elongation) characteristic of the bolt in terms of load applied thereto and T26 represents a displacement (contraction) characteristic of the tightening object in terms of load applied thereto under a condition with $W_1 < R$ and $-W_2 \leq S$. AF 30 represents axial force acting on the bolt and AF 32 represents axial force acting on the tightening object. Also, EF 26 represents external force.

Figure 13E:
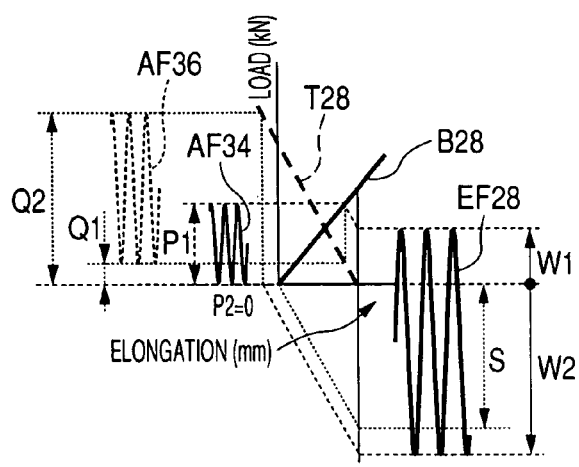

In FIG. 13E, a solid line B28 represents a displacement (elongation) characteristic of the bolt in terms of load applied thereto and T28 represents a displacement (contraction) characteristic of the tightening object in terms of load applied thereto under a condition with $W_1 < R$ and $-W_2 > S$ and $-W_1 \leq S$. AF 34 represents axial force acting on the bolt and AF 36 represents axial force acting on the tightening object. Also, EF 28 represents external force.

Figure 13F:
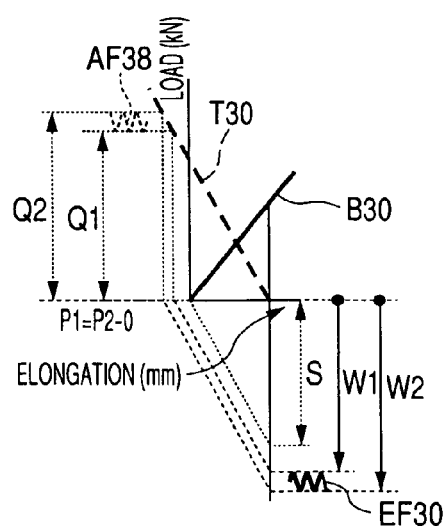

In FIG. 13F, a solid line B30 represents a displacement (elongation) characteristic of the bolt in terms of load applied thereto and T30 represents a displacement (contraction) characteristic of the tightening object in terms of load applied thereto under a condition with $-W_1 > S$. AF 38 represents axial force acting on the tightening object. Also, EF 30 represents external force.

Tolerance loads for all the combinations of the external patterns are calculated in the same manner as those set forth above with calculation results being indicated below.

For a first pattern of external forces with $R \leq W_2$ as shown in FIG. 13A, a tolerance range of the external force for fatigue of a bolt is given by $$W_r \leq \sigma_w \left( A - \frac{W_m}{\sigma_T} \right) \tag{20}$$

A tolerance range of the external force for an elastic limit of the bolt is given by $$W_r \leq Y - W_m \tag{21}$$

No load limit exists for an elastic limit of the tightening object.

For a second pattern of external forces with $W_2 < R \leq W_1$ and $-W_2 \leq S$ shown in FIG. 13B, a tolerance range for the bolt fatigue is expressed as $$W_r \leq \frac{(1+\gamma)\{(\sigma_T - \sigma_w)F + 2\sigma_T\sigma_w A\} - \{2\sigma_w + \gamma(\sigma_T + \sigma_w)\}W_m}{2\sigma_T + \gamma(\sigma_T + \sigma_w)} \tag{22}$$

A tolerance range for the elastic limit of the bolt is given by $$W_r \leq Y - W_m \tag{23}$$

A tolerance range for the elastic limit of the tightening object is given by $$W_r \leq (1+\beta)(Yf - F) + W_m \tag{24}$$

For a third pattern of external forces with $W_2 < R \leq W_1$ and $-W_2 > S$ shown in FIG. 13C, a tolerance range for the bolt fatigue is given by $$W_r \leq \frac{2\sigma_T\sigma_w A}{(\sigma_T + \sigma_w)} - W_m \tag{25}$$

A tolerance range for the elastic limit of the bolt is given by $$W_r \leq Y - W_m \tag{26}$$

A tolerance range for the elastic limit of the tightening object is given by $$W_r \leq Yf + W_m \tag{27}$$

For a fourth pattern of external forces with $W_1 < R$ and $-W_2 \leq B$ shown in FIG. 13D, a tolerance range for the bolt fatigue is given by $$W_r \leq (1+\gamma)\left\{\sigma_w A - \frac{\sigma_w}{\sigma_T}F\right\} - \frac{\sigma_w}{\sigma_T}W_m \tag{28}$$

A tolerance range for the elastic limit of the bolt is given as $$W_r \leq (1+\gamma)(Y-F) - W_m \tag{29}$$

A tolerance range for the elastic limit of the tightening object is given by $$W_r \leq (1+\beta)(Yf - F) + W_m \tag{30}$$

For a fifth pattern of external forces with $W_1 < R$ and $-W_2 > S$ and $-W_1 \leq S$ shown in FIG. 13E, a tolerance range for a fatigue of a bolt is given by $$W_r \leq (1+\gamma)\left\{\frac{2\sigma_T\sigma_w A}{(\sigma_T + \sigma_w)} - F\right\} - W_m \tag{31}$$

A tolerance range for an elastic limit of the bolt is expressed as $$W_r \leq (1+\gamma)(Y-F) - W_m \tag{32}$$

A tolerance range for an elastic limit of a tightening object is given by $$W_r \leq Yf + W_m \tag{33}$$

For a sixth pattern of external forces with $-W_1 > S$ shown in FIG. 13F, no load limits exist for a fatigue and an elastic limit of the bolt.

A tolerance range for an elastic limit of a tightening object is given by $$W_r < Yf + W_m \tag{34}$$

As set forth above, the tolerance loads $W_r$ for all the external force patterns corresponding to FIGS. 13A to 13F can be expressed by formulae 20 to 34.

When performing calculations on the tolerance load $W_r$ in actual practice, the calculations are implemented on the tolerance load $W_r$ for all the six external force patterns. From $W_r$ and $W_m$, $W_1$, $W_2$ are obtained using Equation 12 and comparing $W_1$, $W_2$ to R, S allows the determination as to which of the six cases is associated with the tolerance load $W_r$. This determination results in coincidence with a load of only one kind. $W_r$ corresponding to the coincident kind results in an answer. It is needless to say that using spreadsheet software (such as Excel) enables the execution of such calculations in simplified technique.

Further, under circumstances such as a sealed structure or an electrically conducted section where no tightened portion is loosened, a value of an external force should not exceed loads R, S. That is, R represents an elastic limit of a tension external force under which a bolt is caused to elongate to form a gap at the abutment interface between the bolt and a tightening object. S represents a critical load of a compressive external force under which the tightening object is caused to contract to form the gap at the abutment interface of the tightening object. Accordingly, a tolerance range is given by $$W_r \leq R - W_m \tag{35}$$

$$W_1 \leq S + W_m \tag{36}$$

The relational formulae between all the damage patterns and the external force are clarified, making it easy to make judgment on the screw-tightening element.

A computerized method of designing a tolerance load of a screw-tightening element can be performed on a personal computer using spreadsheet software in a manner as described below.

Figure 1A:
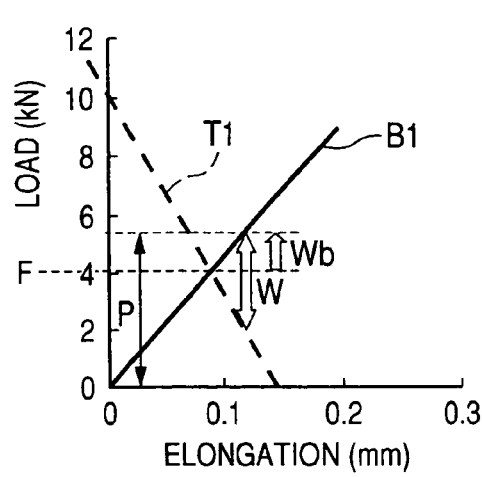
FIG. 1A is a view showing a screw-tightening diagram.
Figure 1B:
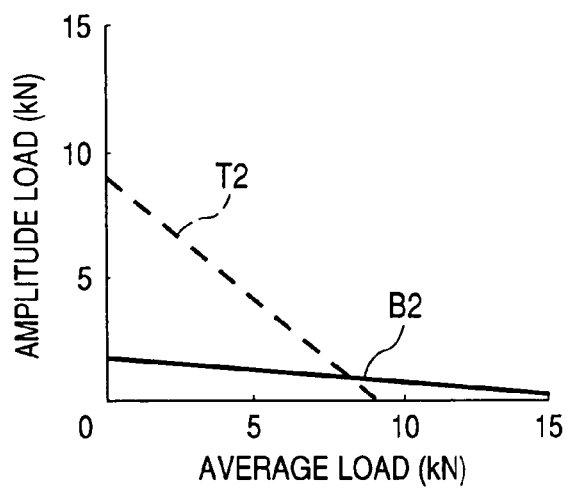
FIG. 1B is a view showing a screw fatigue limit diagram.
Figure 2A:
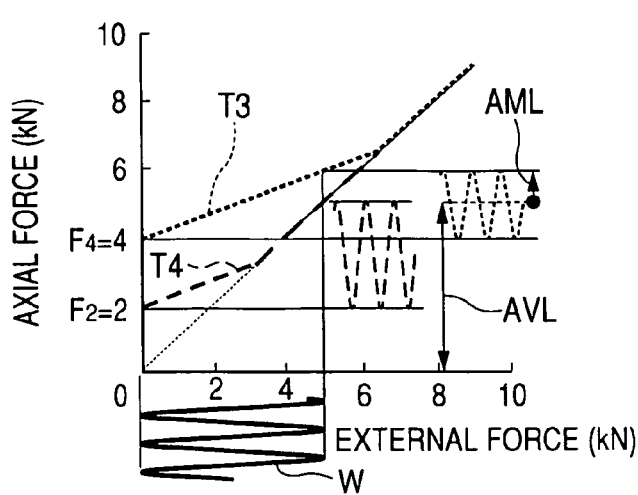
FIG. 2A is a view showing a dynamic fatigue diagram of a screw-tightening element applied with a tightening force and suffering from an external force.
Figure 2B:
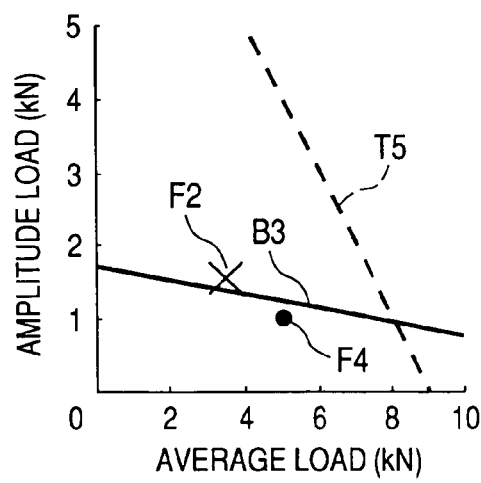
FIG. 2B is a view showing a fatigue limit diagram representing stress condition.
Figure 3A:
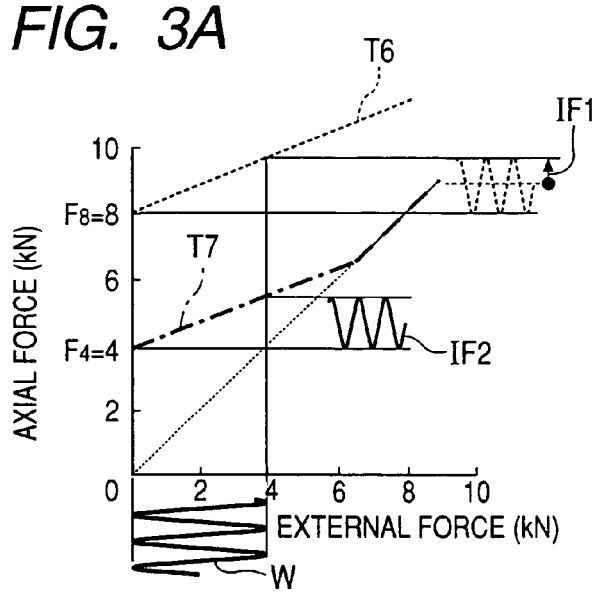
FIG. 3A is a view showing a dynamic fatigue diagram of the screw-tightening element applied with the tightening force and another external force.
Figure 3B:
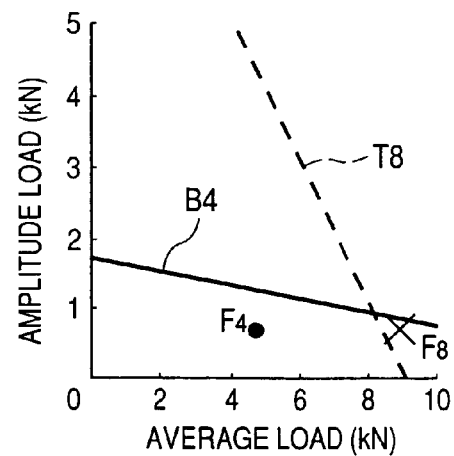
FIG. 3B is a view showing a fatigue limit diagram for the screw-tightening element representing a yield point and a fatigue limit.
Figure 4:
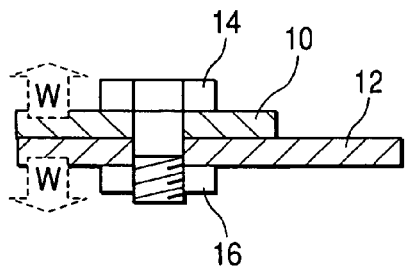
FIG. 4 is a cross-sectional view showing a structural example frequently used in the related art for explaining a screw-tightening element.
Figure 5A:
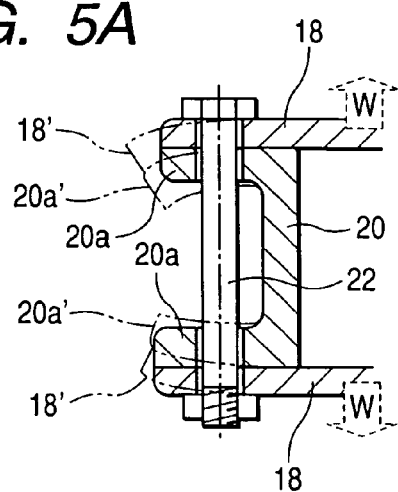
FIG. 5A is a cross-sectional view showing one example of a screw-tightening structure that is liable to undergo plastic deformation.
Figure 5B:
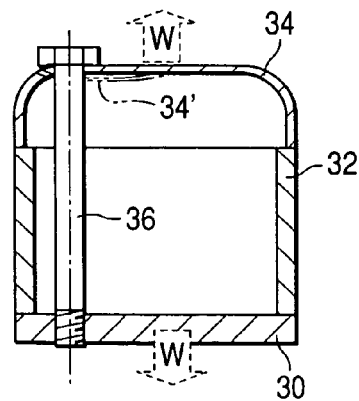
FIG. 5B is a cross-sectional view showing another example of a screw-tightening structure that is liable to undergo plastic deformation.
Figure 6:
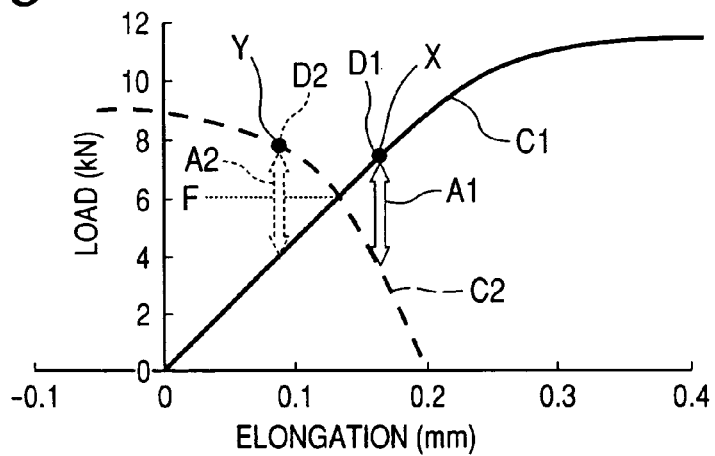
FIG. 6 is a screw-tightening diagram of the screw-tightening structure shown in FIG. 5B.

That is, the screw-tightening element for a structure (representing an example of a starter motor), formed in a structure equivalent to that shown in FIG. 6, was designed using spreadsheet software of the personal computer with reference to an exemplary case listed below.

Damage to a screw thread was calculated using the following factors including:

Screw . . . M5 in size with strength class equivalent to 8.8
Material Strength . . . $\sigma_w = 77$ N/mm², $\sigma_T = 1370$ N/mm²

Elastic Limit . . . Y=9500 N, Yf=7000 N

Spring Constant . . . Kb=44000 N/mm, Kf=89000 N/mm

The calculation results are plotted in FIGS. 14A and 14B and FIGS. 15 to 17.

Figure 14A:
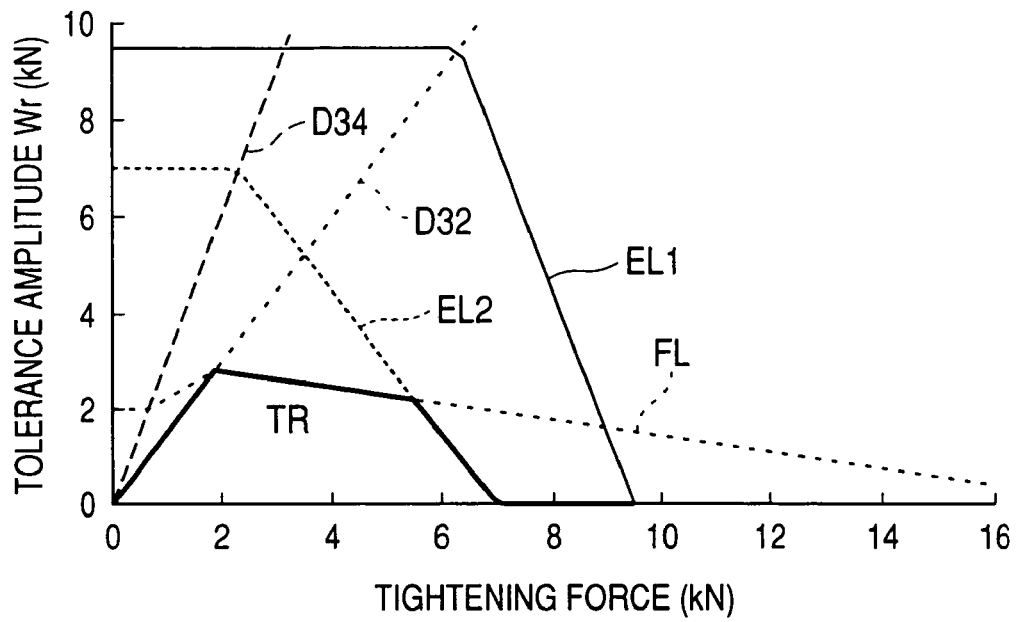
FIGS. 14A and 14B are graphs expressed in a design method according to the present invention.
Figure 14B:
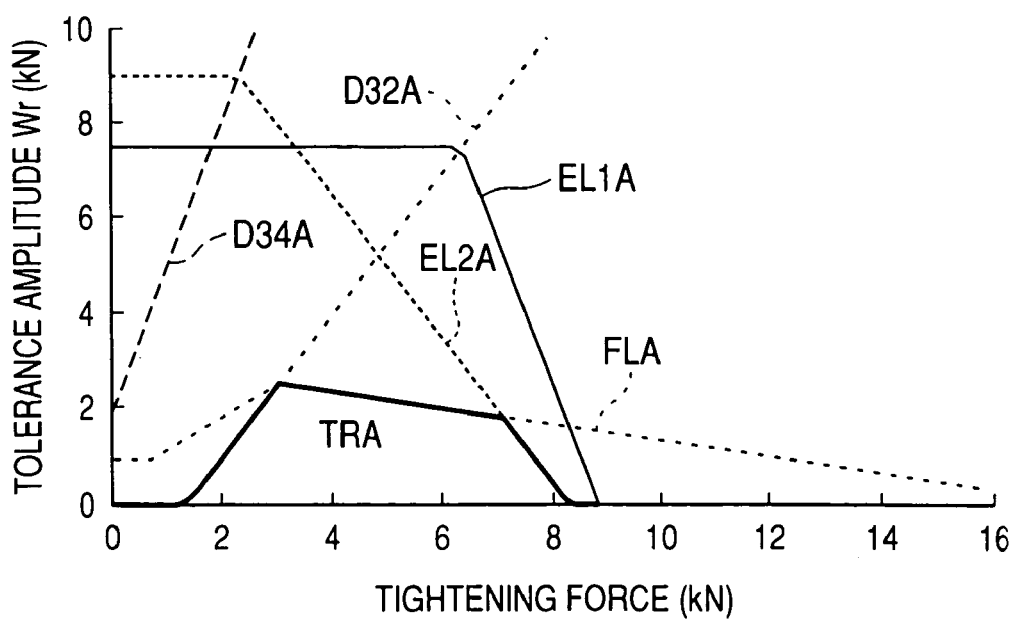

FIGS. 14A and 14B show the relationships each between tolerance amplitude $W_r$ of an external force and a tightening force F. FIG. 14A representing a case in the absence of an average load (with $W_m$=0 corresponding to a purely alternating external force) and FIG. 14B shows a case in the presence of the average load (with $W_m$=2 kN).

In FIG. 14A, a dotted line T32 represents the relationship between the tolerance amplitude and the tightening force applied to a bolt that is caused to elongate to form a gap at an abutment interface of a tightening object. A dotted line T34 represents the relationship between the tolerance amplitude and the tightening force applied to the tightening object that is caused to contract to form a gap at the abutment interface. EL1 is a curve representing an elastic limit of the bolt. EL2 is a curve representing an elastic limit of the tightening object. EL1 is a curve representing an elastic limit of the bolt. FL is a curve representing a fatigue fracture limit. TR represents a tolerance region of an external force.

In FIG. 14B, T32A, T34A, EL1A, EL2A, FLA and TRA correspond to T32, T34, EL1A, EL2, FL and TR of FIG. 14A in the same respective meanings.

For instance, under the condition shown in FIG. 14A, a limit of the external force F is determined such that with a tightening force F falling in a value less than 2 kN, no elastic deformation takes place in the bolt to cause a gap to be formed at the abutment interface of the tightening object and with the tightening force F falling in a value ranging from 2 to 5 kN, no fatigue fracture takes place in the bolt. Furthermore, the limit of the external force Wr is determined such that with the tightening force F falling in a value ranging from 5 to 7 kN, no plastic deformation occurs in the tightening object (so as not to exceed an elastic limit). Even under a condition where no external force is applied, with the tightening force F laying in a value higher than 7 kN, merely tightening the bolt results in the occurrence of plastic deformation. Stated another way, it is perfectly evident from FIG. 14A that if an external force, exceeding critical loads of a tolerance region TR, acts, a particular damage pattern appears depending on the tightening force F.

In general, it is experimentally recommended to tighten such a bolt (with M5 in strength 8.8) with a tightening force F falling in a value of approximately 6 kN and, in such a case, the external force We can only guarantee tightening reliability up to a value of 1 kN.

With the starter motor coupled to a base frame of an engine by means of two bolts, the external force can be tolerated up to 2 kN (of a value approximately 200 kg by weight) that is doubled. The motor has a mass of approximately 4 kg and, hence, the two bolts can bear vibration up to 50 G (=200/4). That is, when such a motor is mounted on the engine, as vibration acting on the motor reaches a value of about 80 G due to resonance, plastic deformation is caused to occur in the tightening object with the resultant loosening of the bolts. In fact, during experimental tests conducted on a real machine, permanent set has occurred on an end cover, playing a role as a tightening object, to cause the loosening of the bolts. This has results in deficiencies with drop-off of the bolts or half-tightened statuses of the bolts under which the bolts are exposed to vibrations each occurring in a direction perpendicular to an axis of the bolt to cause the occurrence of bending fatigue fracture of the bolts. That is, the loosening of the bolt has occurred with vibration of 80 G and continued into bending fatigue due to vibrations occurring in the direction perpendicular to the axes of the bolts upon elapse of the time.

That is, such an issue was a phenomenon that could not be explained without taking into consideration plastic deformation of the tightening object. Assume that the tightening object has no elastic limit line EL2 in FIG. 14A, the tightening object is supposed to resist against the external force of 2 kN and shockproof rises to 100 G with a consequence of bearing vibration of 80 G caused by resonance.

Figure 18:
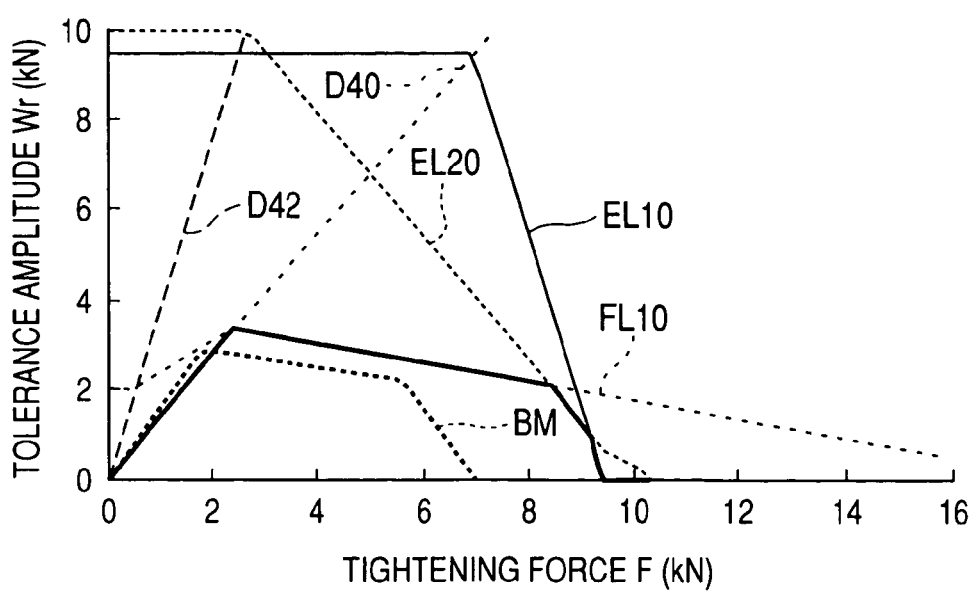
FIG. 18 is a view showing an effect of an improved structure according to the present invention based on a screw-tightening structure shown in FIGS. 14A and 14B.

FIG. 18 is a tightening diagram showing various factors of a bolt and a tightening object and showing a result of an increase in rigidity of an end cover or the like, playing a role as a tightening object, by altering a shape thereto. Such alteration results in numeric change in a spring constant Kf from 89000 to 120000N/mm and an elastic limit Yf from 7000 to 10000N.

In FIG. 18, a dotted line T40 represents the relationship between the tolerance amplitude Wr and the tightening force F applied to a bolt that is caused to elongate to form a gap at an abutment interface of a tightening object. A dotted line T42 represents the relationship between the tolerance amplitude and the tightening force applied to the tightening object that is caused to contract to form a gap at the abutment interface. EL10 is a curve representing an elastic limit of the bolt. EL20 is a curve representing an elastic limit of the tightening object. FL10 is a curve representing a fatigue fracture limit. AM is a thick solid line representing a tolerance region of an external force to be applied to the screw-tightening element after a measure is taken on the tightening object and BM is a thick dotted line representing a tolerance region of an external force to be applied to the screw-tightening element before the measure is taken on the tightening object.

The thick dotted line BM in FIG. 18 represents the tolerance region of the external force before the measure is taken on the tightening object under a situation shown in FIG. 14A. It is thus obvious in FIG. 18 that upon comparison between the curves AM and BM, the tolerating region of the external force available to be applied to the tightening object remarkably increases. This is due to the fact that the effect of Yf results in an increase in the elastic limit of the tightening object and altering Kf causes a proportion of an internal force to be born by the bolt to change with the resultant improvement in fatigue limit. That is, a design method of the related art practice has been implemented in a method of calculating strength of a bolt to address a deficiency thereof for thereby altering the bolt to allow the same to have increased strength. In contrast, with a design method according the present invention, it can be simply understood that a true cause is not present in the bolt but concerned in the tightening object. In fact, various tests have been conducted in the related art to implement a general method on an initial stage with a view to increasing strength of the bolt but almost no successful result could be obtained with such a measure. That is, as will be apparent from FIG. 14A, an attempt to increase the elastic limit of the bolt results in a phenomenon that is irrelevant.

Figure 15:
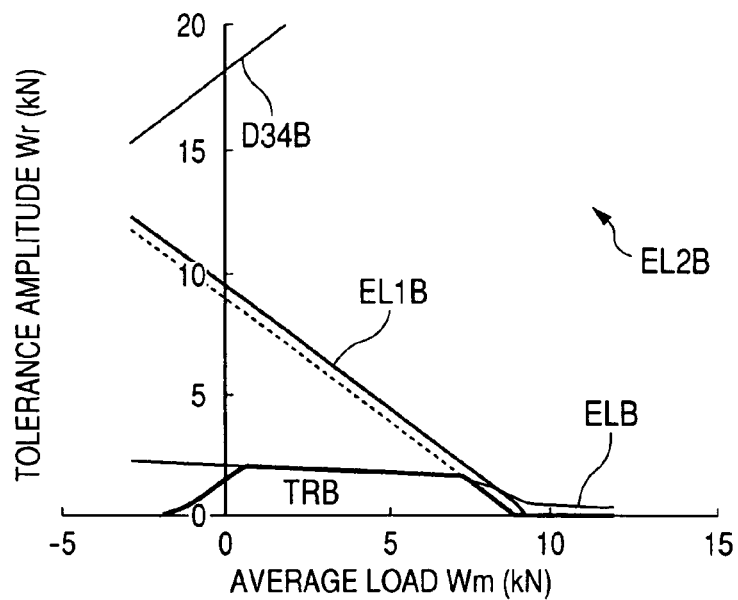
FIG. 15 is a graph representing another expression to explain the design method according to the present invention.

FIG. 15 shows the relationship between a tolerance amplitude $W_r$ and an average load Wm under a condition wherein a bolt is tightened with a tightening force F=6 kN.

In FIG. 15, a dotted line T32B represents the relationship between the tolerance amplitude and the average load applied to a bolt that is caused to elongate to form a gap at the abutment interface of the tightening object. A solid line T34B represents the relationship between the tolerance amplitude and the average load applied to the tightening object that is caused to contract to form a gap at the abutment interface.

EL1B is a line representing an elastic limit of the bolt. EL2B represents an area with an elastic limit of the tightening object. FLB is a curve representing a fatigue fracture limit. TRB represents a tolerance region of an external force. The relationship between various damage patterns and the external force is clearly understood from FIG. 15.

Figure 16:
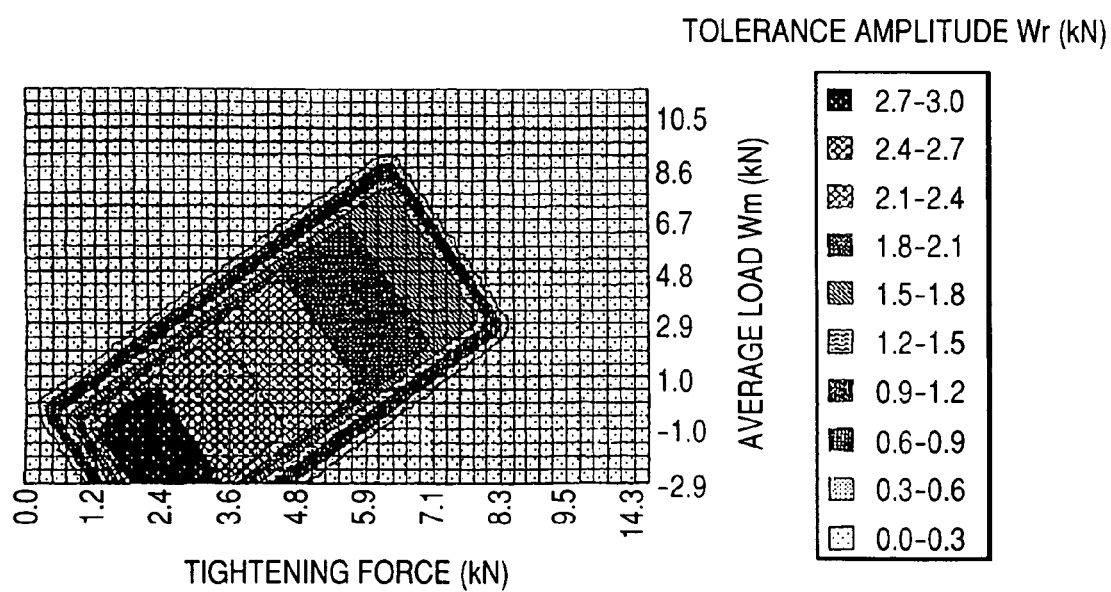
FIG. 16 is a graph showing the design method according to the present invention in a contour line.
Figure 17:
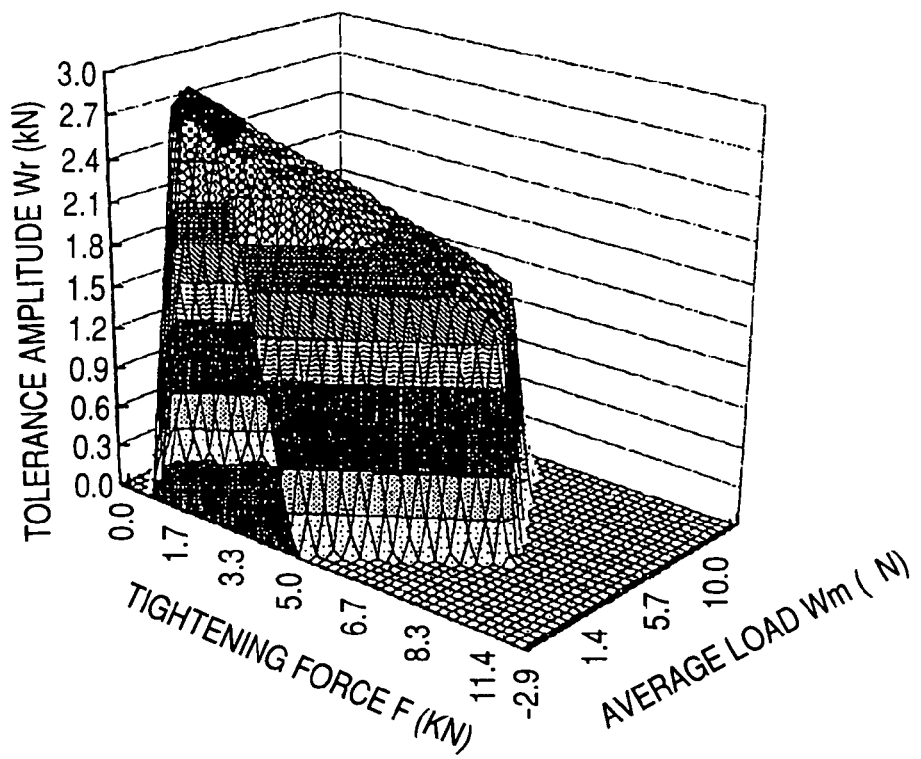
FIG. 17 is a representation of FIG. 16 in 3T.

FIG. 16 represents tolerance regions (tolerance range of an amplitude $W_r$) of the external forces, shown in FIGS. 14A and 14B and FIG. 15, in contoured lines in terms of an average load Wm and a tightening force F. FIG. 17 shows the tolerance regions of FIG. 16 in 3T. FIGS. 16 and 17 show at a glance which tightening force F is to be selected for fluctuating external forces $W_m \pm W_r$. For instance, with a structure having a characteristic shown in FIG. 6, it is clear that for vibration under fluctuating load with Wm=0, a tightening force F=2 kN enables a bolt to bear the largest amplitude of Wr=2.8 kN.

During screw-tightening in actual practice, a torque wrench is used for converting a tightening force into an axial thrust force and, thus, a cross range needs to be present for tightening the screw due to influence of a frictional coefficient. Therefore, the bolt with this size is recommended to be applied with a tightening force of F=6 kN as set forth above and with the tightening force with F=2 kN, a risk occurs on the bolt wherein the tightening force F becomes nearly zeroed due to fluctuation. To address such an issue, if an attempt is made to allow the tightening force F to lie in a vicinity of 5 kN, then, variation results in the elastic limit Yf of the tightening object as described above, with the resultant difficulty in ensuring shockproof of the tightening object. Therefore, it becomes possible to simply discuss on measure to address the issue in a way to make an attempt in which "the elastic limit Yf needs to be improved" in a comprehensive manner.

Thus, the design method of the present invention has no need to blindly perform try and error in calculations and repeatedly execute experiments, making it possible to quickly obtain a result of judgment without causing the omission in study. Studying a screw-tightening element using the diagrams shown in FIGS. 14A and 14b and FIGS. 15 to 17 enables work from an input to an output to be completed with ten seconds. The diagrams shown in FIGS. 14A and 14B and FIGS. 15 to 17 enable damage patterns to be identified and, therefore, the design method of the present invention has an excellent advantage with capability of estimating the magnitude of an external force based on a pattern under which damage takes place. Thus, the present invention makes it possible to perform comprehensive study inclusive of issues such as plastic deformation and a gap resulting from compressive load that had not been mostly considered in the related art practice.

The elastic limit and the proportional limit are mostly identical to each other in normal practice. In fact, elastic limit stress and proportional limit stress are mostly identical to each other in the light of material characteristic. Accordingly, the study on the screw tightening can be entirely calculated using the formulae 20 to 36 set forth above. In recent years, it has been an increasing trend with a tightening object being formed in a structure including a large amount of component parts in combination for the purpose of reduction in cost. This results in consequence with non-linear elastic deformation coming out in the tightening object due to a combination of contours of the component parts even in the presence of elastic deformations in proportional limits of individual component parts. Even if the non-linear elastic deformation takes place, such deformation occurs within the elastic limit and a screw element has no disadvantage. In other words, a remarkable difference is present between the proportional limit and the elastic limit. There is a structure in which elastic deformation takes place in non-linear characteristic from a status with a low load condition. In such a case, the above-described formulae, resulting from calculations through the use of linearity between load and displacement, are hard to be used but a principal concept of the present invention can be utilized. In this case, screw tightening can be effectively performed on numeric analysis using a computer. That is, positively using the computer results in capability of designing the screw tightening on the non-linear characteristic of the tightening object in the same manner as that achieved in designing the screw tightening on the linear characteristic of the tightening object.

Figure 19:
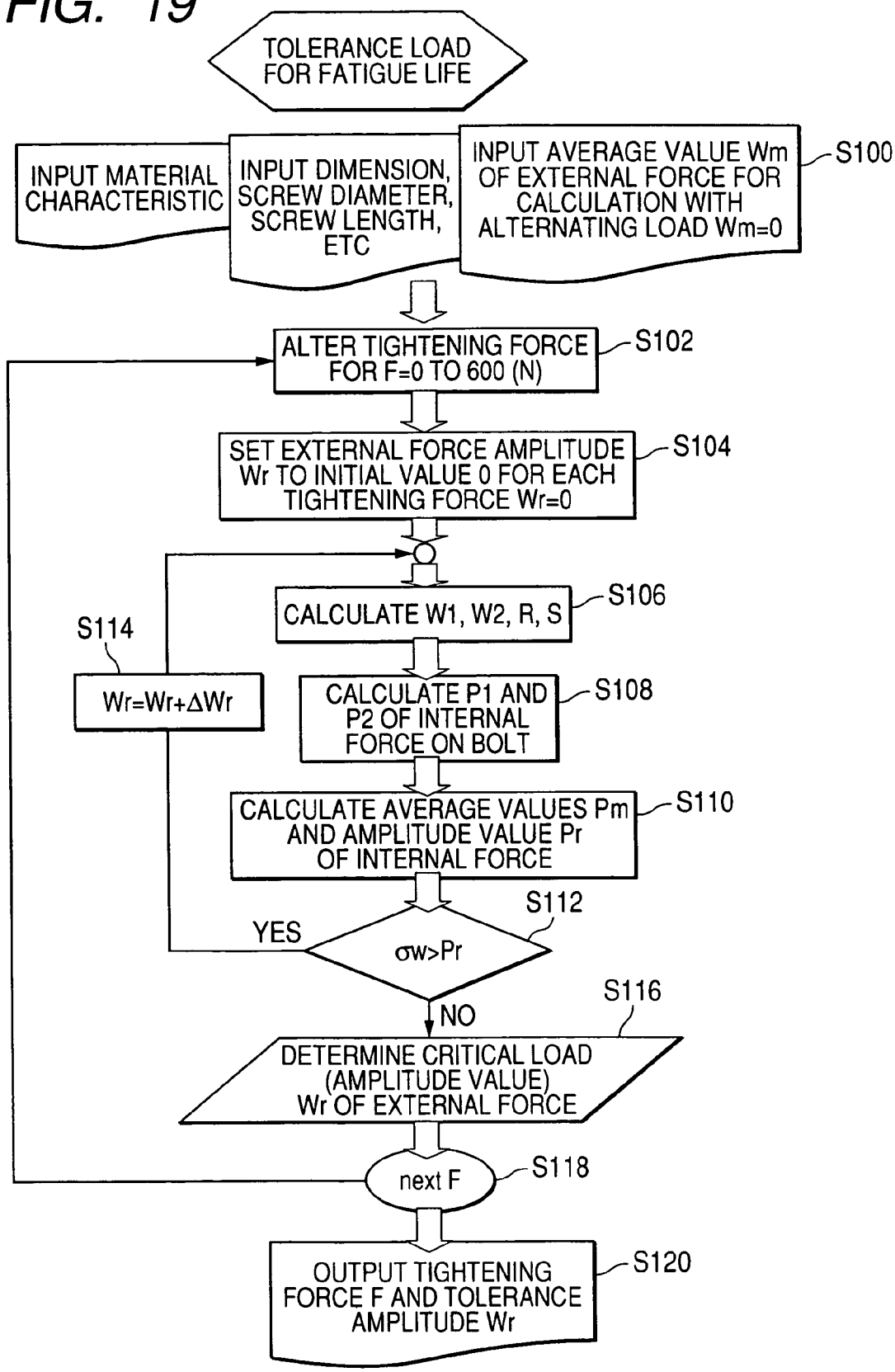
FIG. 19 is a view showing a basic sequence of a flowchart for carrying out a computerized design method according to the present invention.

FIG. 19 is a flowchart showing a basic sequence of operations to be executed on computer-readable software for obtaining amplitudes of external forces, with which a fracture is caused to occur on a tightening element, in terms of respective axial forces when a tightening force varies in a range from 0 to 6000N. Thus, a computerized method of the present invention is implemented on such computer-readable software.

In step S100, input values such as material characteristic, dimensional data such as shapes, a diameter, a length of a screw-tightening component and a tightening object, and an average value $W_m$ of an external force to be calculated are input to a computer.

Next in step S102, a tightening force is caused to vary in a range from 0 to 6000N.

In subsequent step B104, amplitudes $W_r$ of external forces for respective tightening forces are set to initial values.

In succeeding step S106, calculations are executed to obtain a maximal external force $W_1$, a minimal external force $W_2$, a critical load R of a tension external force with which a bolt is caused to elongate to form a gap at an abutment interface of the screw-tightening element, and a critical load B of compressive external load with which a tightening object is caused to contract to form a gap at the abutment interface of the screw-tightening element.

In consecutive step S108, further, calculations are executed to obtain a maximal value P1 and a minimal value P2 of an internal force of the bolt.

In step S110, calculations are executed to obtain an average value Pm and an amplitude value Pr of the internal force based on the above factors.

Next in step S112, judgment is made whether the screw-tightening element encounters a fatigue limit based on the factors obtained in step S110. If judgment is made in step S112 that no fatigue limit is present, then, the operation goes to step S114 for increasing the amplitude of the external force by $\Delta W_r$ for recalculation. In contrast, if judgment is made in step S112 that the fatigue limit is present, then, the operation is executed in step S116 to determine an amplitude value $W_r$ of the external force corresponding to the tightening force.

Further, in step S118, a tightening force F is altered for recalculation.

In step S120, the tightening force F and the tolerance amplitude Wr are output from the computer.

Figure 20:
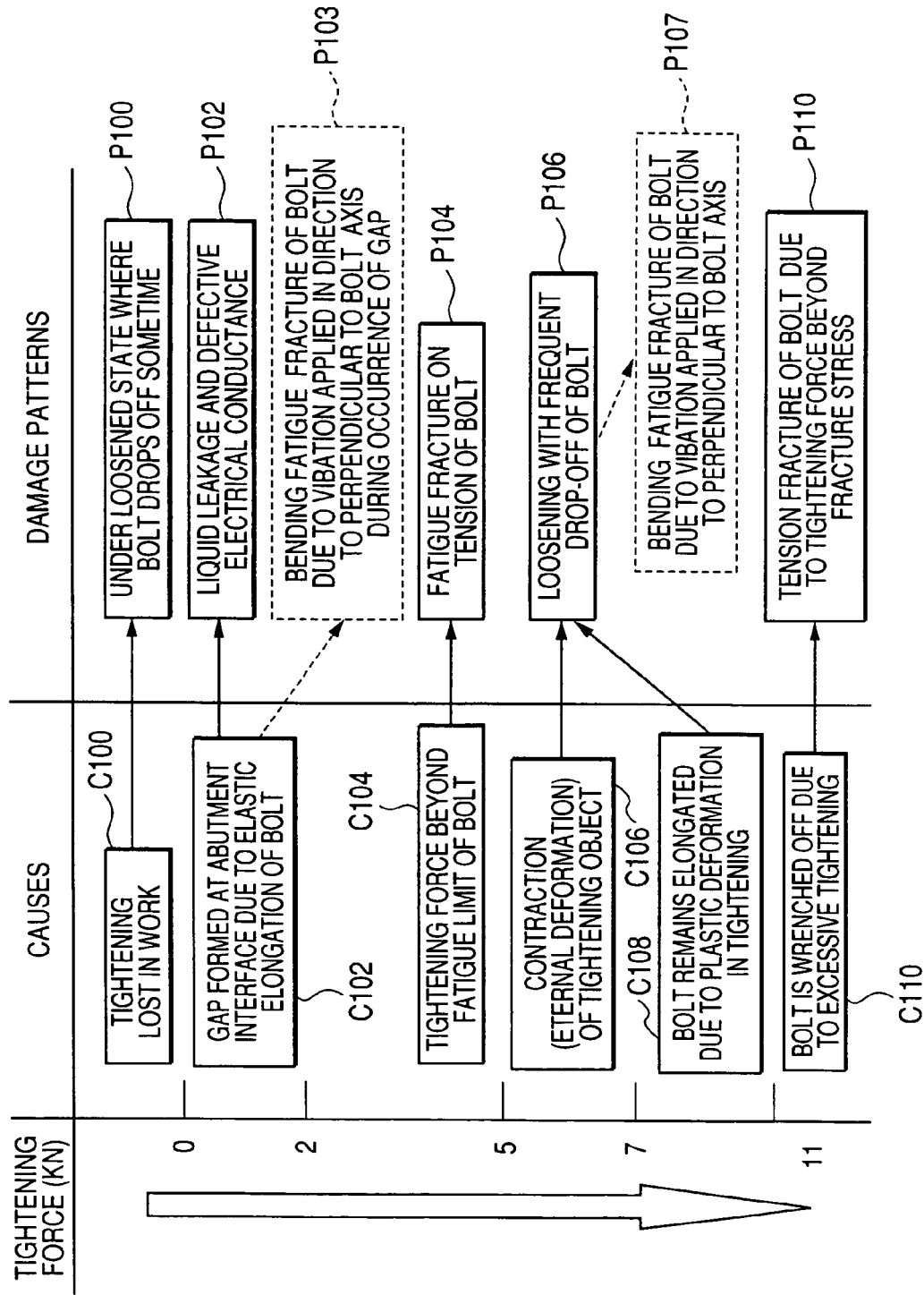
FIG. 20 is a diagram showing the relationship between causes and damage patterns depending on a tightening force applied to a screw-tightening element.

FIG. 20 is a diagram showing overall damage patterns of a screw-tightening component such as a screw or bolt. FIG. 20 represents the relationship between the tightening force and the damage patterns with reference to an exemplary case shown in FIG. 14A. Although tightening a screw with a force of 0.11 kN in misfit is out of the question, it can be easily understood that stress (in an external force) acts on a screw thread of the bolt due to engine vibration and if the magnitude of such stress exceeds a tolerance value, a particular damage pattern appears depending on the tightening force.

In FIG. 20, if tightening of a bolt is forgotten in a cause C100, then, a tightening force is zero and, hence, the bolt remains loosened causing the bolt to drop off sometime under a damage pattern P100. In a cause C102, a gap is created at an abutment interface of a screw-tightening element, that is, in a space between the bolt and an abutment interface of a tightening object due to elastic elongation of the bolt. Under such condition, leakage of liquid takes place or defective electrical conductance takes place under another damage pattern P102. Additionally, during the formation of the gap in C102, the bolt suffers from vibration in a direction perpendicular to an axis of the bolt followed by the occurrence of bending fatigue fracture under another damage pattern P103.

In another cause C104, if the tightening force exceeds a fatigue limit of the bolt, then, the bolt suffers from tension and the bolt undergoes fatigue fracture under another damage pattern P104. As the tightening force further increases beyond 5 kN, then, in a cause C106, the tightening object is caused to contract (under permanent deformation). This results in loosening of the bolt causing the bolt to occasionally drop off from the tightening object under a damage pattern P106. Also, with the bolt loosened, the bolt suffers from vibration in the direction perpendicular to the axis of the bolt followed by the occurrence of bending fatigue fracture under a damage pattern P107.

As the tightening force further increases beyond 7 kN, in a cause C108, tightening the bolt causes plastic deformation to occur and the bolt remains elongated. Under such condition, the bolt enters the damage patterns P106 and P107.

As the tightening force still further increases beyond 11 kN, in a cause C110, the bolt is tightened too tight to cause the bolt to be wrenched off. Thus, the bolt undergoes tensioned fracture due to application of excessive tightening force beyond fracture stress under a damage pattern P110.

As classified above, the terminologies "loosening" or "fracture" alternately appear with the increase of the tightening force. For instance, in discussing a phase of "fracture" with a design method of the related art, it has been completely difficult to understand which portion of a bolt undergoes fracture or what kinds of fractures are involved. On the contrary, with a design method according to the present invention, the damage patterns can be organized and grasped in a clear fashion referring to the graphs in visual states and no omission in design study takes place. Therefore, even during the occurrence of an issue, a response can be simply taken to clear the cause for the issue to take a quick measure. That is, even with the occurrence of fracture of the bolt, a fracture surface allows the positioning of the bolt to be clarified on the ground of a fractography. Further, it is needless to say that the damage patterns for the object to be concerned vary in actual practice depending on the magnitude relationship associated with the tightening force in terms of spring constants Kb, Kf and elastic limits Y, Yf and can be judged from information represented in the graphs.

While the present invention has been described above with reference to the calculation examples for the screw thread being damaged as an object, the present invention may have application to a tensioner bolt, with a structure including an elongated straight portion (with a non-threaded portion) for reduction of internal force in the bolt, wherein a base of a bolt head is liable to fracture. In this case, it is needless to say that calculation for material characteristic (such as $\sigma_w$ and $\sigma_Y$) is executed including a coefficient of stress concentration of the straight portion of the bolt in place of a screw thread portion. This is, a design method of the present invention can be used as a method of designing a screw-tightening element including a screw thread portion and a straight portion.

Thus, the present invention has an excellent advantage in that although it has heretofore been frequently said in the related art "to make an effort to properly tighten a screw-tightening element", every body can easily understand what is a value of "proper tightening" while providing capability of taking a correct measure without taking a wrong or doubtful measure.

By checking quality of a screw design result in the light of a tolerance load obtained on the ground of a screw-tightening structure and material characteristic of a screw-tightening element in contrast to a design method carried out in the related art, the relationship between a damage pattern and an external force, which has heretofore been confusing in the related art, can be made clear to allow a concrete measure to be properly taken. Thus, no need arises for implementing a woefully inefficient procedure such as those including an effort of confirming a result on test on a real machine as done in the related art. Moreover, experimental results can be judged in the light of graphs on screw-tightening diagrams with no error. Also, no need arises for employing a bolt with an unnecessarily increased size and increasing the number of bolts to be used. Additionally, adverse affects occurring on a tightening object, which has not completely studied yet in the related art, are made clear with a design method of the present invention. This provides an ease of designing a tightening object in a decreased size with lightweight with no increase in cost of an auxiliary unit to be used in a modern engine.

Further, in making judgment of damage patterns, the related art design method has heretofore been relied on veteran's know-how. Also, actual judgments have not necessarily resulted in correct consequences or have lead to wrong measures to be taken. To address such an issue, temporary attempt has been taken to unnecessarily increase a size of a bolt. On the contrary, with a design method of the present invention, anybody can easily design a screw-tightening element so as to prevent the occurrence of damage in a highly reliable manner.

Thus, a design method of the present invention provides an excellent advantage of simply making a design of a screw-tightening element with no error.

Figure 21:
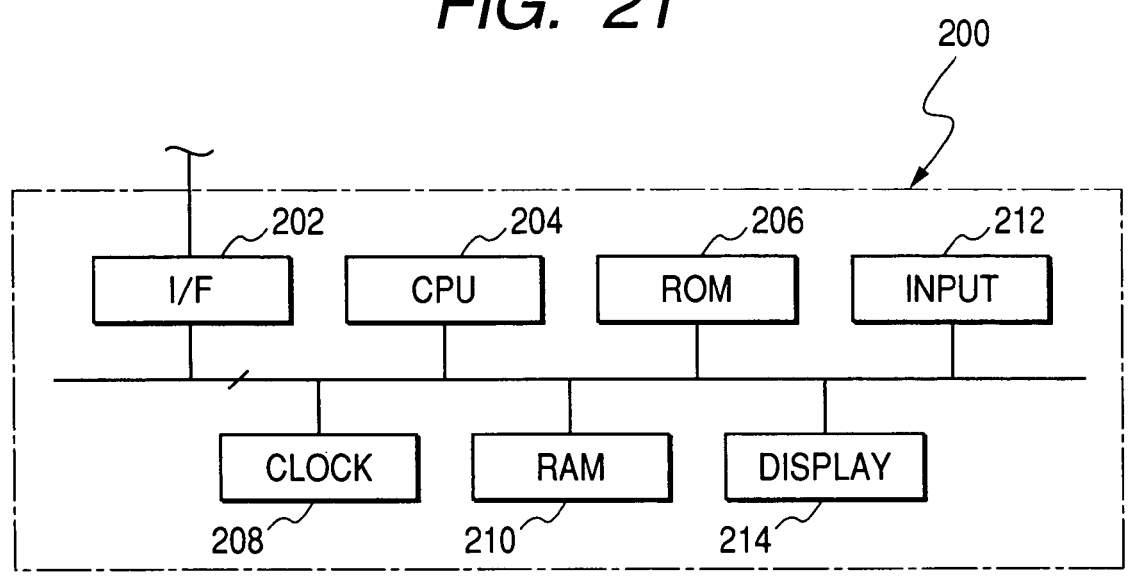
FIG. 21 is a block diagram showing a screw tightening designing apparatus of an embodiment according to the present invention.

FIG. 21 shows a block diagram showing a screw-tightening designing apparatus of an embodiment according to the present invention. It is of course needless to say that the screw-tightening designing apparatus of the present embodiment may have not only application to a bolt connection but also application to a screw connection that is commonly used in the art for tightening plural components together.

For example, the screw-tightening designing method of the present invention can be implemented on the screw-tightening designing apparatus 200 shown in FIG. 21.

The screw-tightening designing apparatus 200 comprises a personal computer (or computer). The computer is comprised of an interface 202, a CPU (Central Processing Unit) 204, a ROM (Read-Only Memory) 206, a source 208 of clock pulses, a RAM (Random Access Memory) 210, an input device 212 and a display 214. The CPU 204 executes a computer readable program whose flowchart is shown in FIG. 19 and data of the program is installed in the ROM 206 in advance. The program shown in FIG. 19 is written to accomplish the judgment of the damage patterns based on the concept according to the present invention.

Specifically, interactively with an engineer, the CPU 204 operates to input dimensions related to a screw diameter and a screw length in step S100, input material characteristics such as an elastic limit, a fatigue limit, true breakdown stress and tension strength in step S100, and input a parameters such as an average value of external force to be calculated. Then, in step S106, the CPU 204 executes calculations to obtain a maximal external force $W_1$, a minimal external force $W_2$, a critical load R of a tension external force with which a bolt is caused to elongate to form a gap at an abutment interface of the screw-tightening element, and a critical load B of compressive external load with which a tightening object is caused to contract to form a gap at the abutment interface of the screw-tightening element. Further, in step S108, the CPU 204 executes calculations to obtain a maximal value P1 and a minimal value P2 of an internal force of the bolt. Then, in step S110, the CPU 204 executes calculations to obtain an average value Pm and an amplitude value Pr of the internal force based on the above factors. Subsequently, in step S 12, the CPU 204 executes judgment using the factors obtained in step S110 whether the screw-tightening element encounters a fatigue limit. If judgment is made in step S112 that no fatigue limit is present, then, the CPU 204 allows the operation to go to step S114 for increasing the amplitude of the external force by $\Delta W_r$ for recalculation. In contrast, if judgment is made in step S112 that the fatigue limit is present, then, the CPU 204 executes the operation in step S116 to determine an amplitude value $W_r$ of the external force corresponding to the tightening force. Further, in step S118, a tightening force F is altered for recalculation. In step S120, the tightening force F and the tolerance amplitude Wr are output by the computer and displayed on the display 214.

While the present invention has been described in detail, it will be appreciated by those skilled in the art that various modifications and alternatives to details of the present invention could be developed in light of the overall teachings of the disclosure. Accordingly, the particular arrangements disclosed are meant to be illustrative only and not limited to the scope of the present invention, which is to be given the full breadth of the following claims and all equivalents thereof.

What is claimed is:

1. A method of designing a tolerance load of a screw-tightening element, composed of a screw component and a tightening object to be fastened in a screw-tightening structure, which is susceptible to a fluctuating cyclic load, the method comprising:

representing, using a computer, material characteristics of the screw component with factors including at least one of an elastic limit, a fatigue limit, a true breakdown stress and a tension strength;

representing a material characteristic of the tightening object with a factor including an elastic limit;

providing a plurality of damage patterns associated with the material characteristics of the screw component and the tightening object; providing a first critical load of a tension force and a second critical load of a compressive force, wherein the first and second critical loads are give by: $R=Kb[(F/Kb)+(F/Kf)]=F[1+(Kb/Kf)]=F[1+(1/\gamma)]=F(1+\beta)$ and $S=Kf[(F/Kb)+(F/Kf)]=F[1+(Kf/Kb)]=F[1+(1/\beta)]=F(1+\gamma)$ where R=the first critical load, S=the second critical load, F=a tightening force applied to the screw-tightening element, Kb=a spring constant of the screw component, Kf=a spring constant of the tightening object, $\beta$=a ratio of a spring constant Kb to a spring constant Kf, and $\gamma$=a ratio of the spring constant Kf to the spring constant Kb;

calculating tolerance values of the fluctuating cyclic load acting on the screw-tightening element based on the damage patterns of the screw-tightening element using the elastic limit of the tightening object, wherein the damage patterns include a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof; and comparing the tolerance values of the fluctuating cyclic load for determining a tolerance load available for the screw-tightening element to withstand the fluctuating cyclic load.

2. The method of designing the tolerance load of the screw-tightening element according to claim 1, wherein:

the tightening object has a structure in which no entire periphery of the screw component is covered.

3. The method of designing the tolerance load of the screw-tightening element according to claim 2, wherein:

the screw-tightening element comprises a structural element of an auxiliary unit to be mounted on an internal combustion engine.

4. A computerized method of designing a tolerance load of a screw-tightening element based on a sequence of a flow chart, the computerized method comprising:

receiving, at a computer, a dimension and a material characteristic of the screw-tightening element as input values; providing a first critical load of a tension force and a second critical load of a compressive force, wherein the first and second critical loads are give by: $R=Kb[(F/Kb)+(F/Kf)]=F[1+(Kb/Kf)]=F[1+(1/\gamma)]=F(1+\beta)$ and $S=Kf[(F/Kb)+(F/Kf)]=F[1+(Kf/Kb)]=F[1+(1/\beta)]=F(1+\gamma)$ where R=the first critical load, S=the second critical load, F=a tightening force applied to the screw-tightening element, Kb=a spring constant of the screw component, Kf=a spring constant of the tightening object, $\beta$=a ratio of a spring constant Kb to a spring constant Kf, and $\gamma$=a ratio of the spring constant Kf to the spring constant Kb;

calculating tolerance values of loads, related to damage patterns including a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof, based on the input values; and comparing the tolerance values for determining a tolerance load for the screw-tightening element.

5. A method of designing a screw-tightening element, composed of a screw component and a tightening object to be fastened in a screw-tightening structure and susceptible to a fluctuating cyclic load, the method comprising: representing, using a computer, material characteristics of the screw component with factor including at least one of an elastic limit, a fatigue limit, a true breakdown stress and tension strength; providing a first critical load of a tension force and a second critical load of a compressive force, wherein the first and second critical loads are give by: $R=Kb[(F/Kb)+(F/Kf)]=F[1+(Kb/Kf)]=F[1+(1/\gamma)]=F(1+\beta)$ and $S=Kf[(F/Kb)+(F/Kf)]=F[1+(Kf/Kb)]=F[1+(1/\beta)]=F(1+\gamma)$ where R=the first critical load, S=the second critical load, F=a tightening force applied to the screw-tightening element, Kb=a spring constant of the screw component, Kf=a spring constant of the tightening object, β=a ratio of a spring constant Kb to a spring constant Kf, and γ=a ratio of the spring constant Kf to the spring constant Kb;

calculating a tolerance load based on a shape of a screw tightening area, a material characteristic damage patterns of the screw-tightening structure, and a tightening force, wherein the damage patterns include a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof;

displaying the relationship between the tightening force and the tolerance load on a graph; and determining an application limit of the screw-tightening element.

6. A method of designing a tolerance load of a screw-tightening element, composed of a screw component and a tightening object to be fastened in a screw-tightening structure, which is susceptible to a fluctuating cyclic load, the method comprising:

representing, using a computer, material characteristics of the screw component with factors including at least one of an elastic limit, a fatigue limit, a true breakdown stress and a tension strength;

representing a material characteristic of the tightening object with a factor including an elastic limit;

providing a plurality of damage patterns associated with the material characteristics of the screw component and the tightening object;

providing a first critical load of a tension force above which the screw component is caused to elongate to form a gap at an abutment interface of the tightening object;

providing a second critical load of a compressive force above which the tightening object is caused to contract to form the gap at the abutment interface of the tightening object wherein the first and second critical loads are give by: R=Kb [(F/Kb)+(F/Kf)]=F[1+(Kb/Kf)]=F[1+(1/γ)=F(1+β) and S=Kf [(F/Kb)+(F/Kf)]=F[1+(Kf/Kb)]= F[1+(1/β)=F(1+γ) where R=the first critical load, S=the second critical load, F=a tightening force applied to the screw-tightening element, Kb=a spring constant of the screw component, Kf=a spring constant of the tightening object, β=a ratio of a spring constant Kb to a spring constant Kf, and γ=a ratio of the spring constant Kf to the spring constant Kb;

calculating tolerance values of the fluctuating cyclic load acting on the screw-tightening element based on the damage patterns of the screw-tightening element using the elastic limit of the tightening object wherein the damage patterns include a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof; and comparing the tolerance values of the fluctuating cyclic load with the first and second critical loads for determining a tolerance load available for the screw-tightening element to withstand the fluctuating cyclic load.

7. The method of designing the tolerance load of the screw-tightening element according to claim 6, further comprising:

providing a plurality of external force patterns acting on the tightening object; and calculating axial forces acting on the screw component and the tightening object.

8. The method of designing the tolerance load of the screw-tightening element according to claim 7, wherein:

the calculating axial forces is executed based on Equations (3) and (4) given as $$P_1 = F + \frac{W_m + W_r}{1 + \gamma} \quad (3)$$

and $$P_2 = F + \frac{W_m - W_r}{1 + \gamma} \quad (4)$$

where
$P_1$=the axial force acting on the screw component
$P_2$=the axial force acting on the tightening object
$W_m$=an average load
$W_r$=the critical load.

9. The method of designing the tolerance load of the screw-tightening element according to claim 8, further comprising:

calculating an average load acting on the screw-tightening element based on the axial forces and the external forces in an Equation (5) expressed as:

$$\sigma_m A = \frac{P_1 + P_2}{2} = F + \frac{W_m}{1 + \gamma} \quad (5)$$

where:
$\sigma_w$=a fluctuating fatigue limit of the bolt
$\sigma_T$=the true breakdown stress
$\sigma_m$=an average stress
$\sigma_r$=an amplitude stress
A=a cross-sectional surface area.

10. The method of designing the tolerance load of the screw-tightening element according to claim 8, further comprising:

calculating an amplitude load acting on the screw-tightening element based on the axial forces and the external forces in Equation (6) expressed as:

$$\sigma_r A = \sigma_w \left(1 - \frac{\sigma_m}{\sigma_T}\right) A = \frac{P_1 - P_2}{2} = \frac{W_r}{1 + \gamma}. \quad (6)$$

11. The method of designing the tolerance load of the screw-tightening element according to claim 8, wherein the comparing the tolerance values of the fluctuating cyclic load comprises determining a tolerance load of the screw component to avoid fatigue fracture thereof using Equation (7) given by $$W_r \leq (1 + \gamma)\left\{\sigma_w A - \frac{\sigma_w}{\sigma_T} F\right\} - \frac{\sigma_w}{\sigma_T} W_m. \quad (7)$$

12. The method of designing the tolerance load of the screw-tightening element according to claim 8, wherein the comparing the tolerance values of the fluctuating cyclic load comprises determining a tolerance load of the screw component to avoid loosening thereof due to plastic deformation using Equation (8) given by $$W_r \leq (1+\gamma)(Y-F)-W_m \quad (8)$$

where:
Y=a yield load of the screw component.

13. The method of designing the tolerance load of the screw-tightening element according to claim 8, wherein the comparing the tolerance values of the fluctuating cyclic load comprises determining a tolerance load of the tightening object to avoid plastic deformation thereof using Equation (9) given by $$W_r \leq (1+\beta)(Yf-F)+W_m \quad (9)$$

where:
Yf=a yield load of the tightening object.

14. A screw-tightening designing apparatus for designing a tolerance load of a screw-tightening element, composed of a screw component and a tightening object to be fastened in a screw-tightening structure, which is susceptible to a fluctuating cyclic load, the screw-tightening designing apparatus comprising:
 a CPU that is input with material characteristics of the screw component representing factors including at least one of an elastic limit, a fatigue limit, a true breakdown stress and a tension strength, a material characteristic of the tightening object representing a factor including an elastic limit; and
 input means for providing a plurality of damage patterns associated with the material characteristics of the screw component and the tightening object; means for providing a first critical load of a tension force and a second critical load of a compressive force, wherein the first and second critical loads are give by: R=Kb [(F/Kb)+(F/Kf)]= F[1+(Kb/Kf)]=F[1+(1/γ)=F(1+β) and S=Kf [(F/Kb)+(F/Kf)]=F[1+(Kf/Kb)]=F[1+(1/β)=F(1+γ) where R=the first critical load, S=the second critical load, F=a tightening force applied to the screw-tightening element, Kb=a spring constant of the screw component, Kf=a spring constant of the tightening object, β=a ratio of a spring constant Kb to a spring constant Kf, and γ=a ratio of the spring constant Kf to the spring constant Kb;
wherein the CPU calculates tolerance values of the fluctuating cyclic load acting on the screw-tightening element based on the damage patterns of the screw-tightening element using the elastic limit of the tightening object;
 wherein the damage patterns include a fatigue fracture of the screw component, a loosening of the screw component due to plastic deformation thereof, a loosening of the screw component due to plastic deformation of the tightening object, an occurrence of a gap formed at a tightened area due to elongation of the screw component within an elastic deformation thereof, and an occurrence of a gap formed at the tightened area due to contraction of the tightening object within an elastic deformation thereof; and
wherein the CPU compares the tolerance values of the fluctuating cyclic load for determining a tolerance load available for the screw-tightening element to withstand the fluctuating cyclic load.

* * * * *